(12) United States Patent
Choi et al.

(10) Patent No.: US 12,181,230 B2
(45) Date of Patent: Dec. 31, 2024

(54) LIQUID COOLING STRUCTURE AND LIQUID COOLING SYSTEM INCLUDING THE LIQUID COOLING STRUCTURE

(71) Applicant: SK hynix Inc., Icheon-si (KR)

(72) Inventors: Nam Hyeon Choi, Icheon-si (KR); Seung Jin Ryu, Icheon-si (KR); Jeong Bae Jeon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 515 days.

(21) Appl. No.: 17/075,435

(22) Filed: Oct. 20, 2020

(65) Prior Publication Data

US 2021/0404751 A1    Dec. 30, 2021

(30) Foreign Application Priority Data

Jun. 29, 2020 (KR) .................. 10-2020-0079239

(51) Int. Cl.
| | |
|---|---|
| H05K 7/20 | (2006.01) |
| F28F 3/04 | (2006.01) |
| F28F 3/12 | (2006.01) |
| F28F 13/00 | (2006.01) |
| F28D 21/00 | (2006.01) |

(52) U.S. Cl.
CPC .................. F28F 3/12 (2013.01); F28F 3/04 (2013.01); F28F 13/003 (2013.01); H05K 7/20636 (2013.01); *F28D 2021/0028* (2013.01); *F28F 2210/02* (2013.01)

(58) Field of Classification Search
CPC .... F28F 1/02; F28F 1/022; F28F 1/025; F28F 3/04; F28F 3/12; F28F 13/003; F28F 2210/02; F28D 2021/0028; H05K 7/20336; H05K 7/20663; H05K 7/20672
See application file for complete search history.

(56) References Cited

U.S. PATENT DOCUMENTS

| | | | | |
|---|---|---|---|---|
| 4,201,263 | A | * | 5/1980 | Anderson ............. F25B 39/022 165/146 |
| 6,253,835 | B1 | * | 7/2001 | Chu .......................... F28F 3/12 174/15.1 |
| 7,965,509 | B2 | | 6/2011 | Campbell et al. |
| 9,335,800 | B2 | | 5/2016 | Druzhinin et al. |
| 2004/0104012 | A1 | * | 6/2004 | Zhou ..................... H01L 23/427 257/E23.088 |
| 2006/0050483 | A1 | * | 3/2006 | Wilson .................. H01L 23/473 361/689 |
| 2008/0190586 | A1 | * | 8/2008 | Robinson ............ H01L 23/4735 361/689 |

(Continued)

FOREIGN PATENT DOCUMENTS

JP    5970896 B2    8/2016

*Primary Examiner* — Jacob R Crum
(74) *Attorney, Agent, or Firm* — WILLIAM PARK & ASSOCIATES LTD.

(57) ABSTRACT

A liquid cooling structure may include a lower structure and an upper structure. The lower structure may be configured to cover one surface of an object. The upper structure may be combined with the lower structure to provide a channel through which a cooling fluid may flow. The channel may include a plurality of passages connected between a channel inlet through which the cooling fluid may enter and a channel outlet through which the cooling fluid may exits.

17 Claims, 16 Drawing Sheets

(56) References Cited

U.S. PATENT DOCUMENTS

| | | | |
|---|---|---|---|
| 2008/0289808 A1* | 11/2008 | Schrader | F28F 1/025 |
| | | | 165/181 |
| 2010/0315780 A1* | 12/2010 | Murakami | H01L 23/473 |
| | | | 361/699 |
| 2011/0216516 A1* | 9/2011 | Kim | H05K 7/00 |
| | | | 361/783 |
| 2013/0255925 A1* | 10/2013 | Koontz | H01L 23/4332 |
| | | | 165/168 |
| 2014/0124182 A1* | 5/2014 | Kwak | H01L 23/473 |
| | | | 165/168 |
| 2019/0212076 A1* | 7/2019 | Lan | F28D 9/0056 |

* cited by examiner

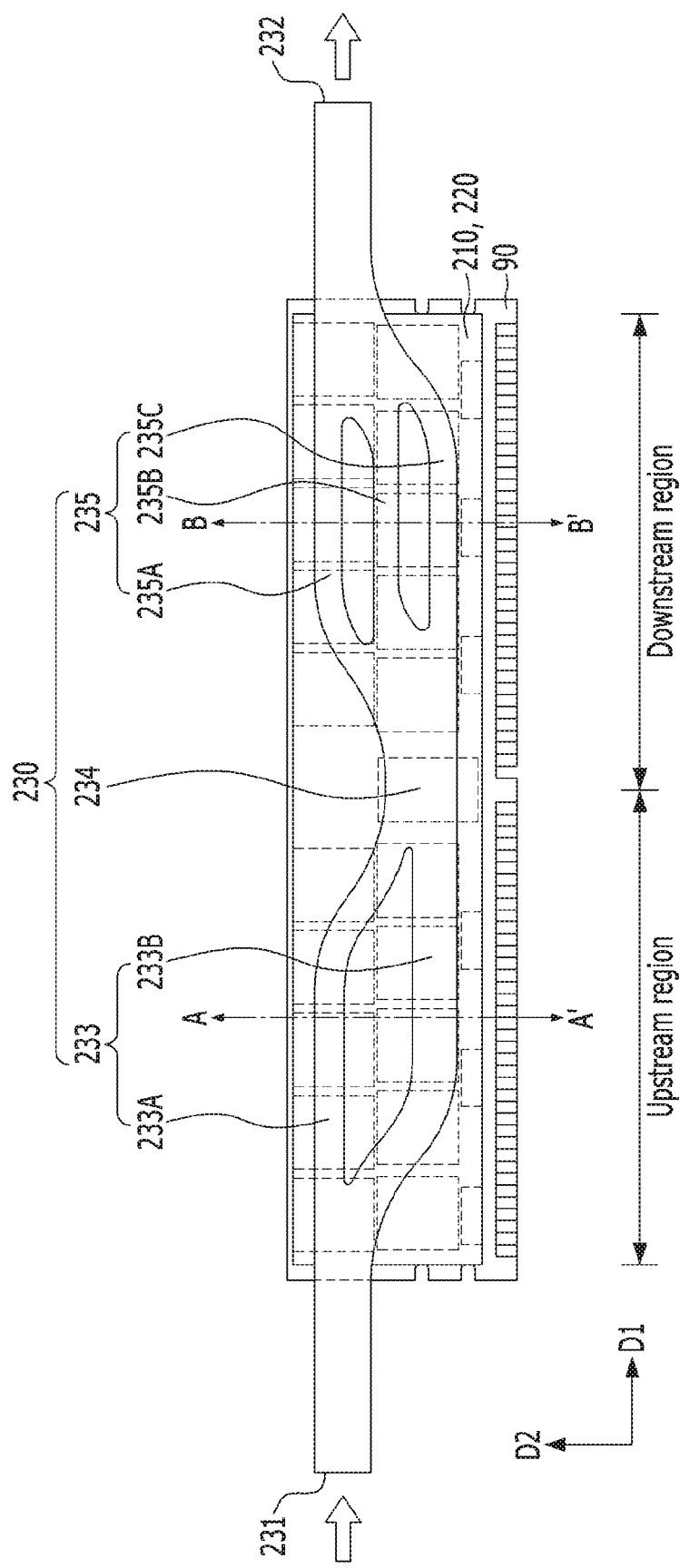

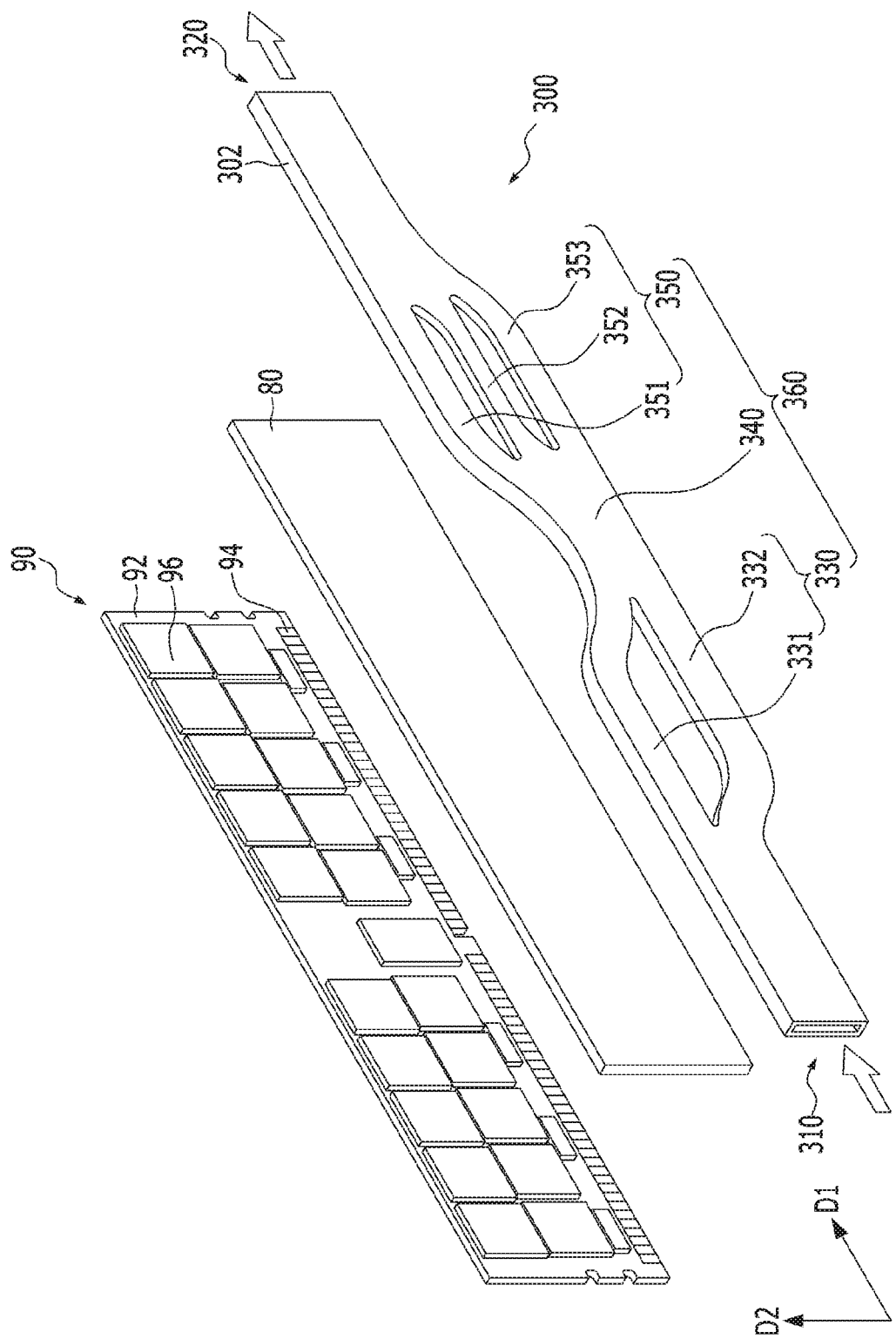

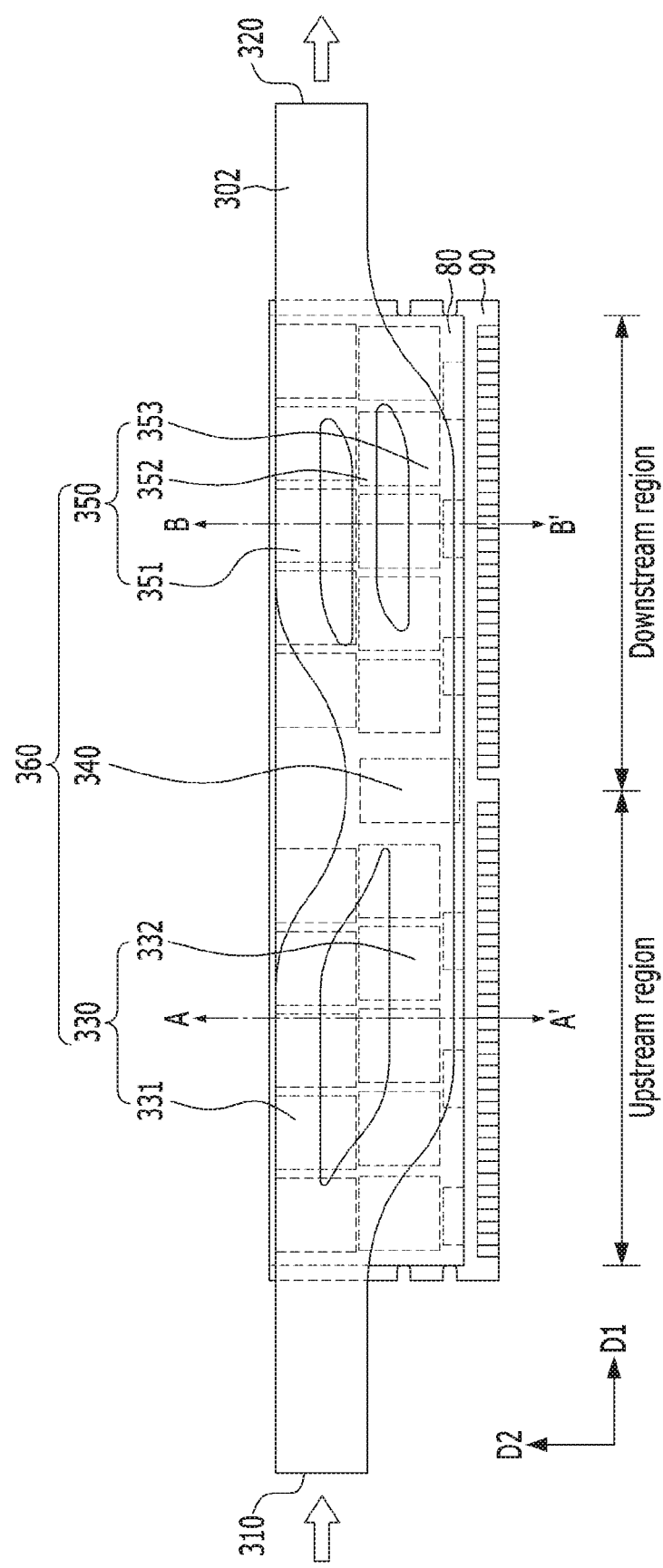

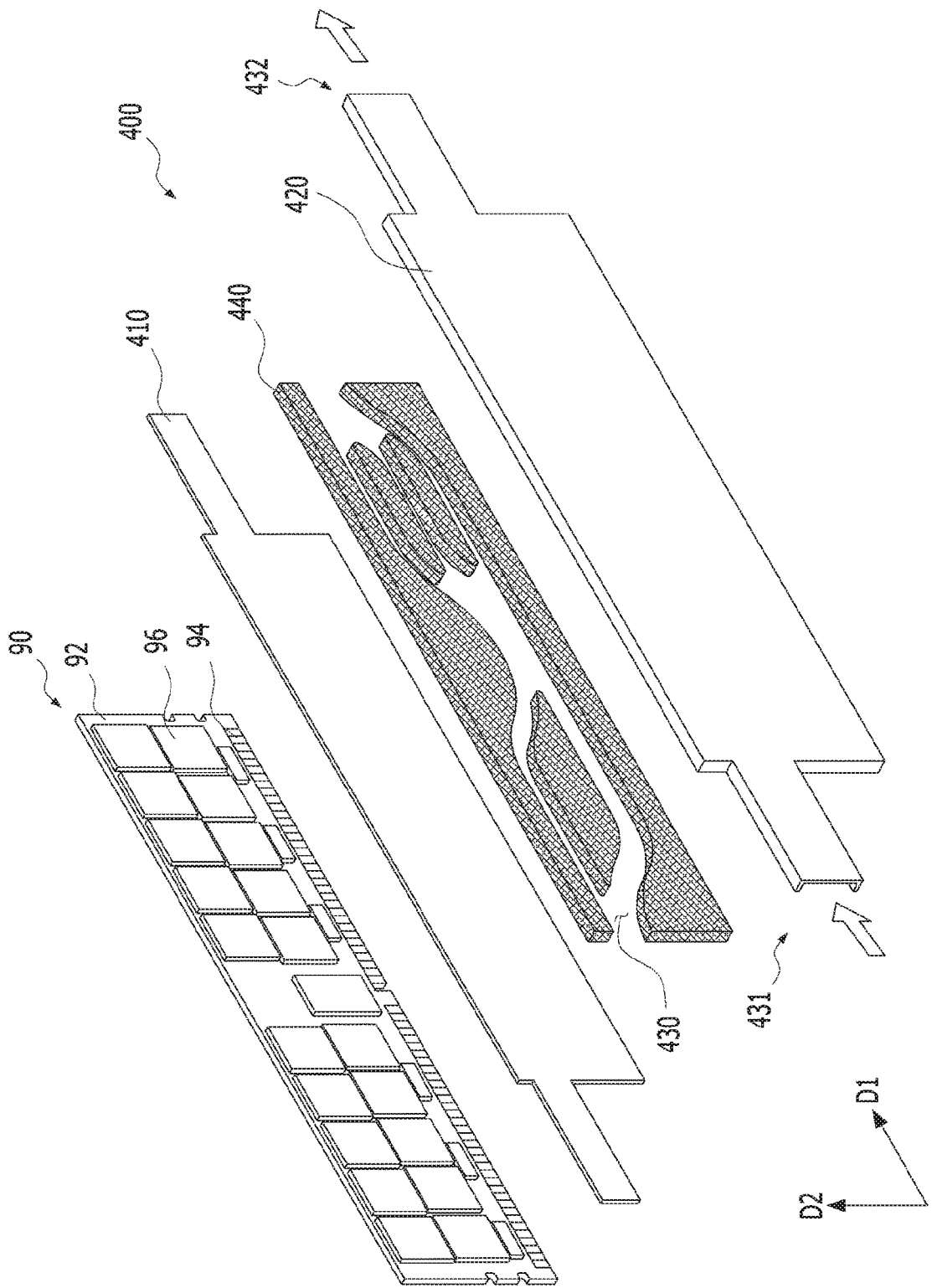

LIQUID COOLING STRUCTURE AND LIQUID COOLING SYSTEM INCLUDING THE LIQUID COOLING STRUCTURE

CROSS-REFERENCES TO RELATED APPLICATION

The present application claims priority under 35 U.S.C. § 119(a) to Korean application number 10-2020-0079239, filed on Jun. 29, 2020, in the Korean Intellectual Property Office, which is incorporated herein by reference in its entirety.

BACKGROUND

1. Technical Field

Various embodiments may generally relate to a cooling system of an electronic device, more particularly to a liquid cooling structure configured to emit heat generated from an electronic device, and a liquid cooling system including the liquid cooling structure.

2. Related Art

A semiconductor industry may have been developed toward a light weight, a thin thickness, a short length and a small size of a semiconductor device and a high integration degree of the semiconductor device. Thus, a semiconductor module may include a printed circuit board (PCB) and a plurality of the semiconductor devices mounted on the PCB. A typical type of the semiconductor module may include a memory module. The memory module may be classified into a single in-lined memory module (SIMM) and a dual in-lined memory module (DIMM). In the SIMM, the semiconductor devices may be mounted on only one surface of the PCB. In contrast, in the DIMM, the semiconductor devices may be mounted on both surfaces of the PCB.

Meanwhile, because the semiconductor devices may be mounted on the PCB, the semiconductor module may have low heat dissipation efficiency. Thus, a cooling structure such as a heat sink may be necessarily installed at the semiconductor module. Recently, a liquid cooling structure having heat dissipation efficiency better than that of an air cooling type may be required.

SUMMARY

In examples of embodiments of the present disclosure, a liquid cooling structure may include a lower structure and an upper structure. The lower structure may be configured to cover one surface of an object. The upper structure may be combined with the lower structure to provide a channel through which a cooling fluid may flow. The channel may include a plurality of passages connected between a channel inlet through which the cooling fluid may enter and a channel outlet through which the cooling fluid may exits.

In examples of embodiments of the present disclosure, a liquid cooling structure may include a heat dissipation pad and a heat dissipation pipe. The heat dissipation pad may be configured to cover one surface of an object. The heat dissipation pipe may be configured to make contact with the heat dissipation pad. A channel through which a cooling fluid may flow may be formed in the heat dissipation pipe. The channel may include a plurality of quadrangular passages connected between a channel inlet through which the cooling fluid may enter and a channel outlet through which the cooling fluid may exits, and a cross-sectional shape of each of the plurality of passages may be substantially quadrangular.

In examples of embodiments of the present disclosure, a liquid cooling structure may include a lower structure and an upper structure. The lower structure may be configured to cover one surface of an object. The upper structure may be combined with the lower structure to provide a channel through which a cooling fluid may flow. The channel may include first to third passages connected between a channel inlet through which the cooling fluid may enter and a channel outlet through which the cooling fluid may exits. Each of the first to third passages may have a substantially quadrangular cross-sectional shape. The first to third passages may be overlapped with an upper portion, a middle portion and a lower portion of the object, respectively, in a direction intersected with a flowing direction of the cooling fluid.

In examples of embodiments of the present disclosure, a liquid cooling structure may include a lower structure and an upper structure. The lower structure may be configured to cover one surface of an object. The upper structure may be combined with the lower structure to provide a channel through which a cooling fluid may flow. The channel may include a channel inlet through which the cooling fluid may enter, a channel outlet through which the cooling fluid may exit, a connection passage arranged between the channel inlet and the channel outlet to physically control a temperature of the cooling fluid, a first group of passages connected between the channel inlet and the connection passage, and a second group of passages connected between the connection passage and the channel outlet.

In examples of embodiments of the present disclosure, a liquid cooling structure may include a heat dissipation pad and a heat dissipation pipe. The heat dissipation pad may be configured to cover one surface of an object. The heat dissipation pipe may be configured to make contact with the heat dissipation pad. A channel through which a cooling fluid may flow may be formed in the heat dissipation pipe. The channel may include a channel inlet through which the cooling fluid may enter, a channel outlet through which the cooling fluid may exit, a connection passage arranged between the channel inlet and the channel outlet to physically control a temperature of the cooling fluid, a first group of passages connected between the channel inlet and the connection passage, and a second group of passages connected between the connection passage and the channel outlet.

In examples of embodiments of the present disclosure, a liquid cooling system may include a memory system, a system board, a cooling fluid supply system, a recirculation system, a first manifold and a second manifold. The memory system may include a plurality of memory modules and a plurality of liquid cooling structures arranged between the memory modules. The system board may include a module socket configured to receive the memory system. The cooling fluid supply system may be configured to supply a cooling fluid to the memory system. The recirculation system may collect the cooling fluid, which may circulate the memory system to have a high temperature, and transfer the cooling fluid having the high temperature to the cooling fluid supply system. The first manifold may be installed at the system board at one side of the memory system to receive the cooling fluid from the cooling fluid supply system and to transfer the cooling fluid to the liquid cooling structures in the memory system. The second manifold may be installed at the system board at the other side of the memory system to collect the cooling fluid having the high temperature and to transfer the cooling fluid the having the high temperature to the recirculation system. Each of the liquid cooling structures may include a lower structure and an upper structure. The lower structure may be configured to cover one surface of an object. The upper structure may be combined with the lower structure to provide a channel through which a cooling fluid may flow. The channel may include a plurality of passages connected between a channel inlet through which the cooling fluid enters and a channel outlet through which the cooling fluid exits, and a cross-sectional shape of each of the plurality of passages may be substantially quadrangular.

In examples of embodiments of the present disclosure, a liquid cooling system may include a memory system, a system board, a cooling fluid supply system, a recirculation system, a first manifold and a second manifold. The memory system may include a plurality of memory modules and a plurality of liquid cooling structures arranged between the memory modules. The system board may include a module socket configured to receive the memory system. The cooling fluid supply system may be configured to supply a cooling fluid to the memory system. The recirculation system may collect the cooling fluid, which may circulate the memory system to have a high temperature, and transfer the cooling fluid having the high temperature to the cooling fluid supply system. The first manifold may be installed at the system board at one side of the memory system to receive the cooling fluid from the cooling fluid supply system and to transfer the cooling fluid to the liquid cooling structures in the memory system. The second manifold may be installed at the system board at the other side of the memory system to collect the cooling fluid having the high temperature and to transfer the cooling fluid the having the high temperature to the recirculation system. Each of the liquid cooling structures may include a heat dissipation pad and a quadrangular heat dissipation pipe. The heat dissipation pad may be configured to cover one surface of an object. The heat dissipation pipe may be configured to make contact with the heat dissipation pad. A channel through which a cooling fluid may flow may be formed in the heat dissipation pipe. The channel may include a plurality of passages connected between a channel inlet through which the cooling fluid enters and a channel outlet through which the cooling fluid exits, and a cross-sectional shape of each of the plurality of passages may be substantially quadrangular.

BRIEF DESCRIPTION OF THE DRAWINGS

The above and another aspects, features and advantages of the subject matter of the present disclosure will be more clearly understood from the following detailed description taken in conjunction with the accompanying drawings, in which:

FIG. 5 is a plan view illustrating a liquid cooling structure in accordance with the second example embodiments;

FIG. 7 is a perspective view illustrating a liquid cooling structure in accordance with third example embodiments;

FIG. 8 is a plan view illustrating a liquid cooling structure in accordance with the third example embodiments;

FIG. 10 and FIG. 11 are perspective view illustrating a liquid cooling structure in accordance with fourth example embodiments;

DETAILED DESCRIPTION

Figure 1:
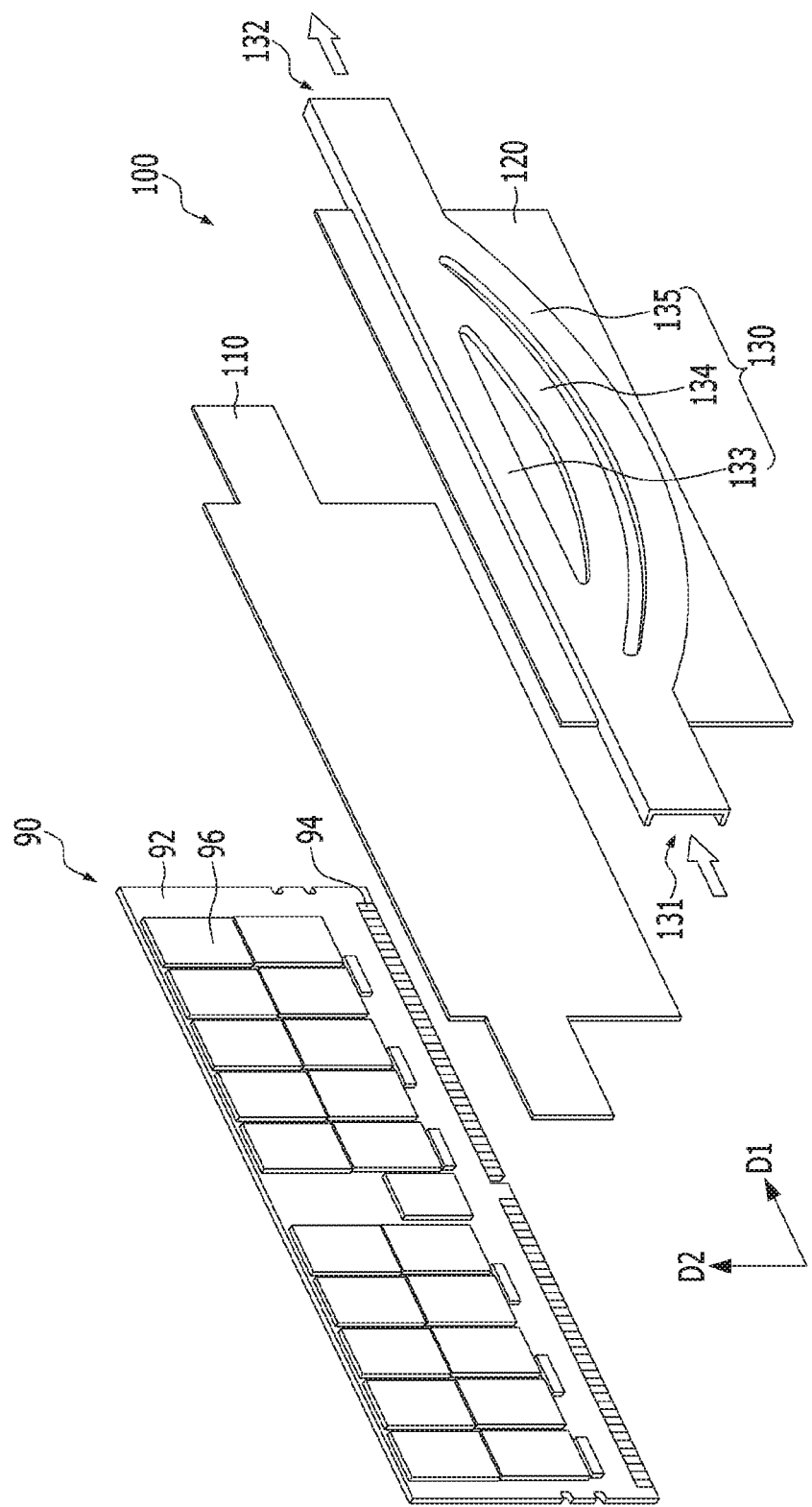
FIG. 1 is a perspective view illustrating a liquid cooling structure in accordance with first example embodiments.

Various embodiments of the present disclosure will be described with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the concept. Although a few embodiments of the present disclosure will be shown and described, it will be appreciated by those of ordinary skill in the art that changes may be made in these embodiments without departing from the principles and spirit of the present disclosure.

Examples of embodiments may provide a liquid cooling structure and a liquid cooling system including the liquid cooling structure configured to effectively dissipate heat generated from an electronic device, for example, a plurality of semiconductor devices on a PCB. Hereinafter, for conveniences of explanations, an object cooled by the liquid cooling structure may include, for example but not limited to, a memory module as the electronic device. Particularly, the memory module may include a high-power density DIMM having a high heat amount. Meanwhile, the object may include all electronic devices that generate heat during operation other than the memory module.

Further, a first direction D1 may correspond to a flowing direction of a cooling fluid and a second direction D2 may be substantially perpendicular to the first direction D1. For example, the first direction D1 may be an X-axis direction, and the second direction D2 may be a Y-axis direction.

Examples of embodiments may provide a liquid cooling structure that may be capable of effectively dissipating heat generated from an electronic device.

Examples of embodiments also may provide a liquid cooling system including the above-mentioned liquid cooling structure.

According to examples of embodiments, the passages may be branched at a region adjacent to the channel inlet and joined at a region adjacent to the channel outlet to improve cooling efficiency of the object.

Further, the channel may include the passages. Thus, an overlapped area and an overlapped position between the object and the channel may be readily controlled to more improve the cooling efficiency of the object.

Furthermore, the channel may include the connection passage configured to control the temperature of the cooling fluid to more improve the cooling efficiency of the object.

Moreover, an overlapped area between the first group of the passages and the object may be larger than an overlapped area between the second group of the passages and the memory module to more improve the cooling efficiency of the object.

Figure 2:
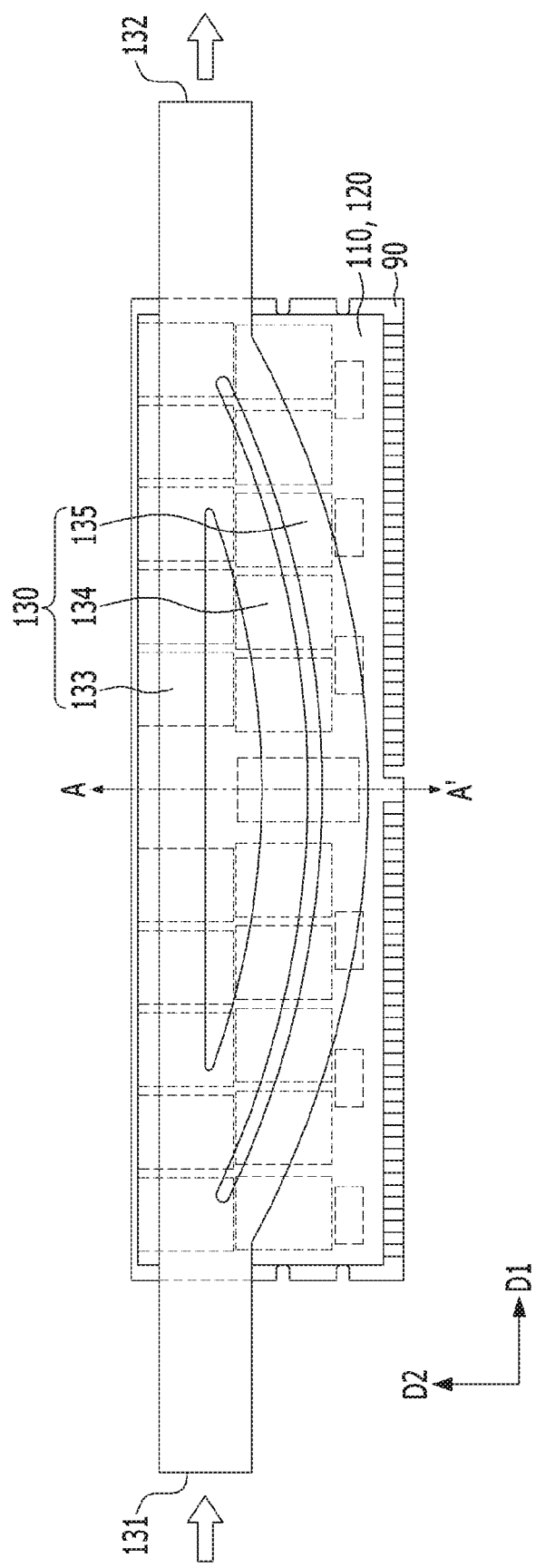
FIG. 2 is a plan view illustrating a liquid cooling structure in accordance with the first example embodiments.
Figure 3A:
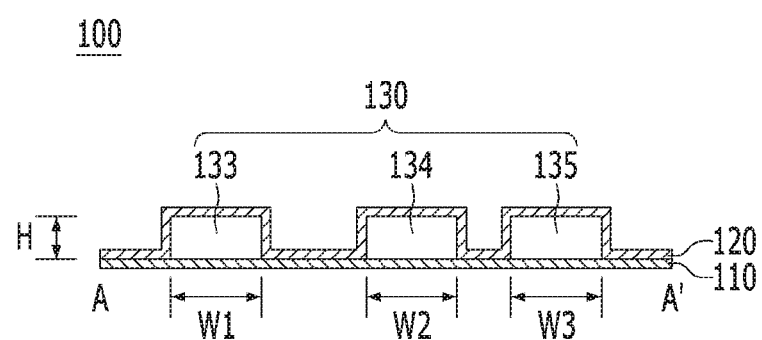
FIG. 3A is a cross-sectional view taken along a line A-A' in FIG. 2 in accordance with the first example embodiments.
Figure 3B:
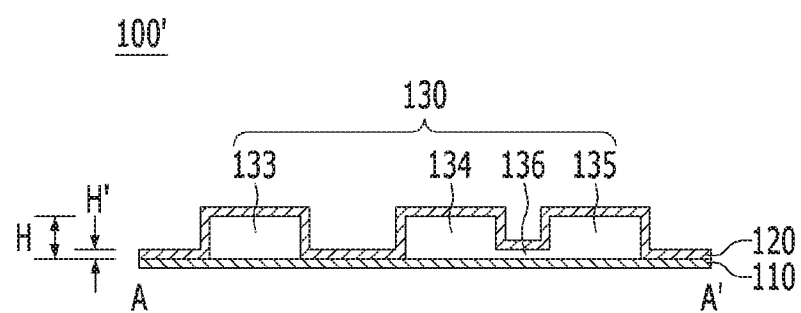
FIG. 3B is a cross-sectional view taken along a line A-A' in FIG. 2 in accordance with another example embodiment.

FIG. 1 is a perspective view illustrating a liquid cooling structure in accordance with first example embodiments, FIG. 2 is a plan view illustrating a liquid cooling structure in accordance with the first example embodiments, FIG. 3A is a cross-sectional view taken along a line A-A' in FIG. 2 in accordance with the first example embodiments, and FIG. 3B is a cross-sectional view taken along a line A-A' in FIG. 2 in accordance with another example embodiment.

Referring to FIGS. 1, 2 and 3A, a liquid cooling structure 100 of first example embodiments may include a lower structure 110 and an upper structure 120. The lower structure 110 may be configured to cover one surface of a memory module 90 as the object. The upper structure 120 may be overlapped with the memory module 90. The upper structure 120 may be combined with the lower structure 110 to provide a channel 130 through which the cooling fluid may flow. The channel 130 may include a plurality of passages connected between a channel inlet 131 and a channel outlet 132. The cooling fluid may enter into the liquid cooling structure 100 through the channel inlet 131. The cooling fluid may exit from the liquid cooling structure 100 through the channel outlet 132. An arrow in drawings may be the flowing direction of the cooling fluid. The cooling fluid may include, for example but not limited to, water.

The memory module 90 may include a PCB 92 and a plurality of semiconductor devices 96. The PCB 92 may include a connection terminal 94 electrically connected to a module socket. The connection terminal 94 may be installed at a lower portion of the PCB 92 in the second direction D2. The semiconductor devices 96 may be mounted on the PCB 92. The semiconductor devices 96 may include a memory device, a data buffer, a controller, a power management integrated circuit (PMIC), an inductor, etc. For example, the controller may be positioned at a middle portion of the PCB 92 in the first direction D1 and a lower portion of the PCB 92 adjacent to the connection terminal 94 in the second direction D2. The PMIC and the inductor may be positioned at the middle portion of the PCB 92 in the first direction D1 and an upper portion of the PCB 92 in the second direction D2. The memory device may be positioned at both sides of the controller in the first direction D1. The data buffer may be positioned at the lower portion of the PCB 92 in the second direction D2.

The lower structure 110 may act as a heat dissipation member. The lower structure may function as to supplement a dead zone of heat dissipation in the channel 130 through which the cooling fluid may flow. Thus, the lower structure 110 may include a readily processed material having a high thermal conductivity, for example, a metal. The lower structure 110 may be configured to fully cover the semiconductor devices 96 on one surface of the memory module 90. The lower structure 110 may be attached to one surface of the memory module 90 using a thermal tape. The thermal tape may include a double-sided tape having a thermal interface material (See FIG. 16).

Further, the lower structure 110 may have a plate shape configured to fully cover the semiconductor devices 96 on one surface of the memory module 90. The lower structure 110 may include a metal plate having a high thermal conductivity. When the semiconductor devices 96 on one surface of the PCB 92 have substantially the same thickness or height, the lower structure 110 may include a metal plate having a flat surface. In contrast, when the semiconductor devices 96 on one surface of the PCB 92 have different thicknesses or heights, the lower structure 110 may include a metal plate having topology corresponding to the thicknesses of the semiconductor devices 96. That is, when the semiconductor devices 96 on one surface of the PCB 92 have different thicknesses or heights, the lower structure 110 may include the metal plate having the topology corresponding to step portions of the PCB 92. Further, when the semiconductor devices 96 on one surface of the PCB 92 have different thicknesses or heights, the lower structure 110 may include a metal plate having a flat surface configured to cover the semiconductor devices 96 having the same thickness except for the semiconductor devices 96 having relatively thick thicknesses.

The upper structure 120 may act as the heat dissipation member together with the lower structure 110. The upper structure 120 may function as to provide a channel 130 through which the cooling fluid may flow. The upper structure 120 may include a readily processed material having a high thermal conductivity, for example, a metal. The upper structure 120 may include the metal substantially the same as the metal of the lower structure 110. Alternatively, the upper structure 120 may include a metal having a thermal conductivity different from a thermal conductivity of a metal of the lower structure 110. When the thermal conductivity of the upper structure 120 is different from the thermal conductivity of the lower structure 110, this may function as to prevent a difference between the thermal conductivities of the memory module 90 at one end of the liquid cooling structure 100 and the memory module 90 at the other end of the liquid cooling structure 100 caused by a shape of the liquid cooling structure 100 (See FIG. 16). Further, the upper structure 120 may include a metal plate. An engraved structure such as a relief structure or an intaglio structure may be formed on the metal plate to form the channel 130 extending in the first direction D1. However, the engraved structure may be formed on the metal plate of the upper structure 120 to form the channel 130, not restricted within the above-mentioned structure. Alternatively, the upper structure 120 may include only the relief structure or the intaglio structure. In other words, when the upper structure 120 may have a shape corresponding to that of the channel 130, the upper structure 120 may include the metal plate having a "⊏" shape, i.e., a frame shape having one opened portion. Here, the frame shape may refer to a metal plate structure processed into an "⊏" shape to have a shape corresponding to the channel. An opened portion of the "⊏" shaped upper structure 120 may be downwardly oriented to combine the upper structure 120 with the lower structure 110, thereby forming the channel 130. In an embodiment, the upper structure 120 may include a metal plate having an engraved structure to form the channel, or a frame-shaped metal plate having one opened portion corresponding to a shape of the channel 130 as shown in FIG. 1.

The lower structure 110 and the upper structure 120 may be combined with each other by a brazing process or a threaded combination process. The channel 130 through which the cooling fluid may flow may provide a sealed fluid passage by combining the lower structure 110 and the upper structure 120 with each other. Further, the lower structure 110 and the upper structure 120 may include protrusions protruded from both ends of the lower and upper structures 110 and 120 to form the channel inlet 131 through which the cooling fluid may enter and the channel outlet 132 through which the cooling fluid may exit. The channel inlet 131 and the channel outlet 132 may be protrusions protruded from both ends of the memory modules 90 to readily assemble and dissemble the liquid cooling structure 100 and a manifold (See FIG. 14) of a liquid cooling system with/from each other.

The channel 130 through which the cooling fluid may flow may have a shape having a cross aspect ratio of about 1 or a value adjacent to about 1 considered flow characteristics of the cooling fluid. Particularly, a cross-sectional shape of the channel 130 may have the cross aspect ratio of about 1 or a value adjacent to about 1 to minimize a pressure drop, thereby allowing a smooth flowing of the cooling fluid and to prevent and/or mitigate the cooling efficiency from being decreased, although the temperature of the cooling fluid may be increased. The cross-sectional shape of the channel 130 may include a square shape, a rectangular shape, a polygonal shape, an elliptical shape having both flat sides in a short axial direction, etc. Here, the short axis direction may be a vertical direction (or a height direction) orthogonal to the first direction D1 and the second direction D2, and the long axis direction may be the second direction D2. When the channel 130 may have the elliptical shape having the both flat sides in the short axial direction, any one of the both flat sides may be provided by the lower structure 110. Here, the channel 130 having a circular shape may have a fluid characteristic better than that of the channel 130 having the square shape, the rectangular shape, the polygonal shape and the elliptical shape. However, because the channel 130 having a circular shape may have a contact area between the memory module 90 and the channel 130 smaller than a contact area between the memory module 90 and the channel 130 having the square shape, the rectangular shape, the polygonal shape and the elliptical shape, the channel 130 having the circular shape may have a very low cooling efficiency by the cooling fluid.

The channel 130 may include the channel inlet 131 and the channel outlet 132 positioned at both ends of the channel 130. The channel inlet 131 and the channel outlet 132 may be positioned at a same line on the first direction D1. The channel inlet 131 and the channel outlet 132 may be positioned at the upper portion of the memory module 90 in the second direction D2. The position of the channel inlet 131 and the channel outlet 132 at the upper portion of the memory module 90 may function as to readily assemble and dissemble the liquid cooling structure 100 and the manifold of the liquid cooling system (See FIG. 14) with/from each other. Therefore, the liquid cooling system may be readily maintained and repaired.

Further, the channel 130 may include a plurality of passages branched from the channel 130 in accordance with the temperature of the cooling fluid and a temperature of a heating element to control a flux and a speed of the cooling fluid. Each of the passages may have a square shape, a rectangular shape, a polygonal shape, an elliptical shape having both flat sides in a short axial direction, etc. The passages may have substantially the same height H regardless of the shape of the passages. Particularly, the channel 130 may include a first passage 133, a second passage 134 and a third passage 135 connected between the channel inlet 131 and the channel outlet 132. The first passage 133, the second passage 134 and the third passage 135 may be extended in the first direction D1. The first passage 133, the second passage 134 and the third passage 135 may be branched from a region adjacent to the channel inlet 131 in the first direction D1. In an embodiment, the passages (i.e., first to third passages 133-135) branched from the channel inlet 131 as shown in FIG. 1 may be referred to as branched passages and these branched passages may be joined at a region adjacent to the channel outlet 132 as shown in FIG. 1. The first passage 133, the second passage 134 and the third passage 135 may be joined at a region adjacent to the channel outlet 132 in the first direction D1. For example, the branched region of the first passage 133, the second passage 134 and the third passage 135 may be one end of the memory module 90. The joined region of the first passage 133, the second passage 134 and the third passage 135 may be the other end of the memory module 90.

The first passage 133 may be connected between the channel inlet 131 and the channel outlet 132 to cool the upper portion of the memory module 90 in the second direction D2. The first passage 133 may have a linear shape connected between the channel inlet 131 and the channel outlet 132. The first passage 133 may have a square shape, a rectangular shape, a polygonal shape, an elliptical shape having both flat sides in a short axial direction, etc. In an embodiment, the first passage 133 may have a cross-sectional shape that is substantially quadrangular (i.e., see FIG. 3A). A flux and a speed of the cooling fluid in the first passage 133 may be controlled by a width W1 of the first passage 133.

The second passage 134 may be connected between the channel inlet 131 and the channel outlet 132 to cool the middle portion of the memory module 90 in the second direction D2. The second passage 134 may have a linear shape configured to connect the channel inlet 131 with the channel outlet 132 a "U" shape. The second passage 134 may have a square shape, a rectangular shape, a polygonal shape, an elliptical shape having both flat sides in a short axial direction, etc. In an embodiment, the second passage 134 may have a cross-sectional shape that is substantially quadrangular (i.e., see FIG. 3A). The second passage 134 may have a cross aspect ratio substantially the same as or different from a cross aspect ratio of the first passage 133. In other words, the cross-sectional shape of the second passage 134 may be substantially the same as or different from the cross-sectional shape of the first passage 133. Thus, when the cross aspect ratio of the second passage 134 may be substantially the same as the cross aspect ratio of the first passage 133, the second passage 134 may have a width W2 substantially the same as the width W1 of the first passage 133. In contrast, when the cross aspect ratio of the second passage 134 may be different from the cross aspect ratio of the first passage 133, the width W2 of the second passage 134 may be different from the width W1 of the first passage 133. For example, in order to increase a cooling efficiency of the middle portion of the memory module 90 rather than a cooling efficiency of the upper portion of the memory module 90 in the second direction D2, an overlapped area between the first passage 133 and the memory module 90 may be smaller than an overlapped region between the second passage 134 and the memory module 90. Thus, because the height H of the first passage 133 may be substantially the same as the height H of the second passage 134, the width W2 of the second passage 134 may be wider than the width W1 of the first passage 133. In contrast, in order to increase the cooling efficiency of the upper portion of the memory module 90 rather than the cooling efficiency of the middle portion of the memory module 90 in the second direction D2, the overlapped area between the first passage 133 and the memory module 90 may be larger than the overlapped region between the second passage 134 and the memory module 90. Thus, because the height H of the first passage 133 may be substantially the same as the height H of the second passage 134, the width W2 of the second passage 134 may be narrower than the width W1 of the first passage 133. A flux and a speed of the cooling fluid in the second passage 134 may be controlled by a width W2 of the second passage 134.

The third passage 135 may be connected between the channel inlet 131 and the channel outlet 132 to cool the lower portion of the memory module 90, which may be adjacent to the connection terminal 94 connected to the module socket, in the second direction D2. The third passage 135 may have a linear shape configured to connect the channel inlet 131 with the channel outlet 132 a "U" shape. The third passage 135 may have a square shape, a rectangular shape, a polygonal shape, an elliptical shape having both flat sides in a short axial direction, etc. In an embodiment, the third passage 135 may have a cross-sectional shape that is substantially quadrangular (i.e., see FIG. 3A). The third passage 135 may have a height H substantially the same as the height of the first passage 133 and the second passage 134. The third passage 135 may have a cross aspect ratio substantially the same as or different from the cross aspect ratio of the first passage 133 and the cross aspect ratio of the second passage 134. A flux and a speed of the cooling fluid in the third passage 135 may be controlled by a width W3 of the third passage 135.

As mentioned above, the cross aspect ratios and the planar shapes of the first to third passages 133, 134 and 135 may be changed in accordance with kinds of the memory module 90, i.e., arrangements and kinds of the semiconductor devices 96 on the PCB 92. In other words, the cross aspect ratios and the planar shapes of the first to third passages 133, 134 and 135 may be changed in accordance with heating values of the memory module 90 by positions.

Meanwhile, in the first example embodiments, a case in which the shape of the channel 130 is defined by molding the upper structure 120 is exemplified, but is not limited thereto. As another example embodiment, the shape of the channel 130 may be defined by a porous member or a pin structure fixedly installed on the lower structure 110 or the upper structure 120. Here, the pin structure may include a plurality of pins spaced apart from each other, and each of the plurality of pins may have a column shape. In addition, the planar shape of each of the plurality of pins may be a triangular or more polygonal, circular, or elliptical shape.

Further, in the first example embodiments, a case in which each of the plurality of passages constituting the channel 130 is separated from each other by molding the upper structure 120 is exemplified, but is not limited thereto. As another example embodiment, each of the plurality of passages may be separated from each other by a porous member or a pin structure formed in the channel 130.

In the first example embodiments, the second passage 134 may be physically separated from the third passage 135, not restricted within the above structure. As shown in FIG. 3B, in a liquid cooling structure 100' of another example embodiment, the passages may be connected with each other through one or more sub-passages. The one or more sub-passages may be located between adjacent passages. For example, adjacent passages such as the second passage 134 and the third passage 135 may be connected with each other through a sub-passage 136. The sub-passage 136 may be positioned between the second passage 134 and the third passage 135 in the second direction D2. The sub-passage 136 may have a U-shaped linear shape extended in the first direction to be positioned on a plane substantially coplanar with the second passage 134 and the third passage 135. In order to increase cooling efficiencies of the middle portion and the lower portion of the memory module 90 compared to the upper portion of the memory module 90, the sub-passage 136 connected between the second passage 134 and the third passage 135 may function to increase a supplying amount of the cooling fluid and the overlapped area between the cooling fluid and the memory module 90. Further, in order to suppress a pressure drop generated by the sub-passage 136 between the second passage 134 and the third passage 135, the sub-passage 136 may have a height lower than the height H of the second passage 134 and the third passage 135. The one or more sub-passages may be located between adjacent passages, but the embodiments are not limited in this way and the one or more sub-passages may be located outside adjacent passages.

In FIG. 3B, a case in which the sub-passage 136 is formed by molding the upper structure 120 is illustrated, but is not limited thereto. As another example embodiment, although not shown in the drawings, the sub-passage 136 may be formed by a porous member or a pin structure fixedly installed on the upper structure 120. The porous member and the pin structure may be fixedly installed on the lower structure 110. It may serve provide a sub-passage 136 having a height H' lower than the height H of the second passage 134 and the third passage 135.

According to the first example embodiments, the liquid cooling structure 100 may include the lower structure 110 configured to cover the one surface of the object and the upper structure 120 combined with the lower structure 110 to provide the channel 130 through which the cooling fluid may flow. The channel 130 may include the passages branched from the region adjacent to the channel inlet 131 and joined at the region adjacent to the channel outlet 132 to improve the cooling efficiency of the object.

Further, the overlapped area and the overlapped region between the object and the channel 130 may be readily controlled by the passages of the channel 130 to further improve the cooling efficiency of the object.

Figure 4:
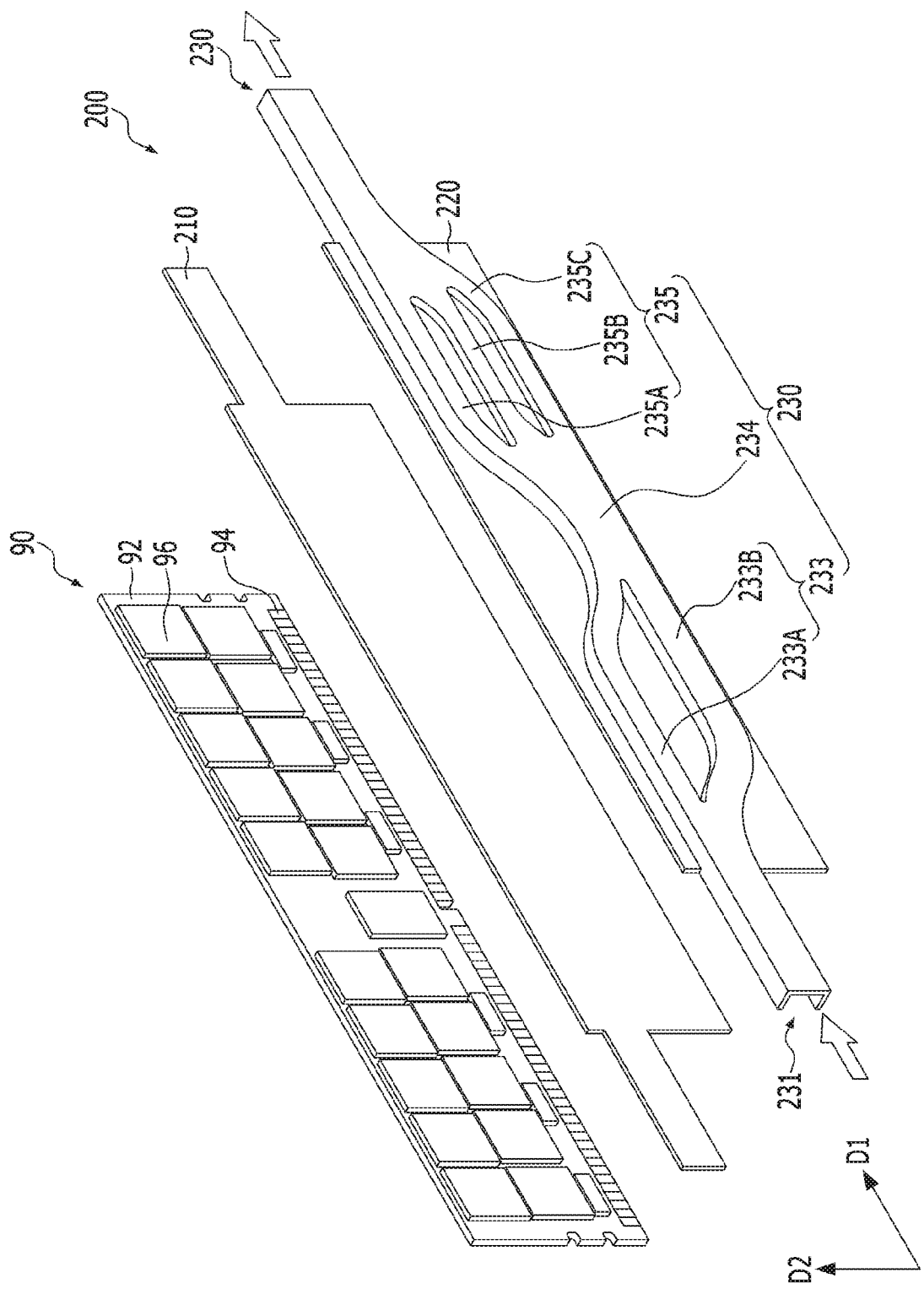
FIG. 4 is a perspective view illustrating a liquid cooling structure in accordance with second example embodiments.
Figure 6A:
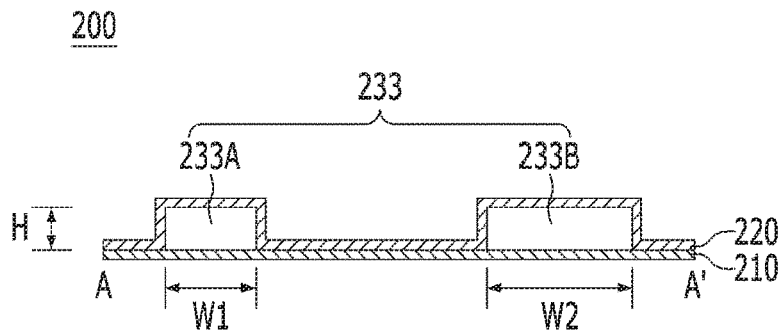
FIG. 6A is a cross-sectional view taken along a line A-A' in FIG. 5 in accordance with the second example embodiments.
Figure 6B:
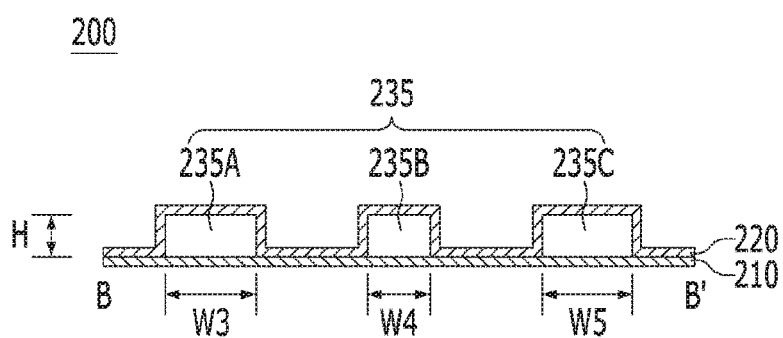
FIG. 6B is a cross-sectional view taken along a line B-B' in FIG. 5 in accordance with the second example embodiments.
Figure 6C:
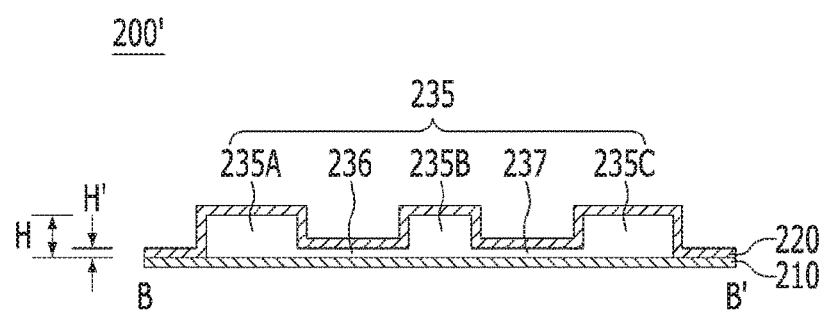
FIG. 6C is a cross-sectional view taken along a line B-B' in FIG. 5 in accordance with another example embodiment.

FIG. 4 is a perspective view illustrating a liquid cooling structure in accordance with second example embodiments, FIG. 5 is a plan view illustrating a liquid cooling structure in accordance with the second example embodiments, FIG. 6A is a cross-sectional view taken along a line A-A' in FIG. 5 in accordance with the second example embodiments, FIG. 6B is a cross-sectional view taken along a line B-B' in FIG. 5 in accordance with the second example embodiments, and FIG. 6C is a cross-sectional view taken along a line B-B' in FIG. 5 in accordance with another example embodiment.

For conveniences of explanations, the same reference numerals in the first example embodiments may refer to the same element of the second example embodiments and any further illustrations with respect to the same element may be omitted herein for brevity.

Referring to FIGS. 4, 5, 6A and 6B, a liquid cooling structure 200 of the second example embodiments may include a lower structure 210 and an upper structure 220. The lower structure 210 may be configured to cover one surface of a memory module 90 as the object. The upper structure 220 may be overlapped with the memory module 90. The upper structure 220 may be combined with the lower structure 210 to provide a channel 230 through which the cooling fluid may flow. The channel 230 may include a channel inlet 231, a channel outlet 232 and a connection passage 234. The cooling fluid may enter into the liquid cooling structure 200 through the channel inlet 231. The cooling fluid may exit from the liquid cooling structure 200 through the channel outlet 232. The connection passage 234 may be positioned between the channel inlet 231 and the channel outlet 234. The connection passage 234 may function as to physically control a temperature of the cooling fluid. The channel 230 may further include a first group of quadrangular passages 233 connected between the channel inlet 231 and the connection passage 234, and a second group of quadrangular passages 235 connected between the connection passage 234 and the channel outlet 232. An arrow in drawings may be the flowing direction of the cooling fluid. The cooling fluid may include, for example but not limited to, water.

The lower structure 210 and the upper structure 220 of the second example embodiments may have structures substantially the same as those of the lower structure 110 and the upper structure 120 of the first example embodiments. Thus, any further illustrations with respect to the lower structure 210 and the upper structure 220 may be omitted herein for brevity.

The channel 230 through which the cooling fluid may flow may have a shape having a cross aspect ratio of about 1 or a value adjacent to about 1 considered flow characteristics of the cooling fluid. Particularly, a cross-sectional shape of the channel 230 may have the cross aspect ratio of about 1 or a value adjacent to about 1 to minimize a pressure drop, thereby allowing a smooth flowing of the cooling fluid and to prevent the cooling efficiency from being decreased, although the temperature of the cooling fluid may be increased. The cross-sectional shape of the channel 230 may include a square shape, a rectangular shape, a polygonal shape, an elliptical shape having both flat sides in a short axial direction, etc. When the channel 230 may have the elliptical shape having the both flat sides in the short axial direction, any one of the both flat sides may be provided by the lower structure 210.

The channel 230 may include the channel inlet 231 and the channel outlet 232 positioned at both ends of the channel 130, and the connection passage 234 positioned between the channel inlet 231 and the channel outlet 232. The connection passage 234 may be positioned at the middle portion of the memory module 90 in the first direction D1 and at the lower portion of the memory module 90 in the second direction D2. For example, the connection passage 234 may be overlapped with the controller of the memory module 90. The channel inlet 231 and the channel outlet 232 may be positioned at a same line on the first direction D1. The channel inlet 231 and the channel outlet 232 may be positioned at the upper portion of the memory module 90 in the second direction D2. The position of the channel inlet 231 and the channel outlet 232 at the upper portion of the memory module 90 may function as to readily assemble and dissemble the liquid cooling structure 200 and the manifold of the liquid cooling system (See FIG. 14) with/from each other. Therefore, the liquid cooling system may be readily maintained and repaired.

Further, the channel 230 may include a plurality of passages branched from the channel 230 in accordance with the temperature of the cooling fluid and a temperature of a heating element to control a flux and a speed of the cooling fluid. Each of the passages may have a square shape, a rectangular shape, a polygonal shape, an elliptical shape having both flat sides in a short axial direction, etc. The passages may have substantially the same height H regardless of the shape of the passages. Particularly, the channel 130 may include the first group of the quadrangular passages 233 connected between the channel inlet 231 and the connection passage 234, and the second group of the quadrangular passages 235 connected between the connection passage 234 and the channel outlet 232. The first group of the passages 233 may include a first passage 233A and a second passage 233B. The second group of the passages 235 may include a third passage 235A, a fourth passage 235B and a fifth passage 235C. In order to prevent the cooling efficiency from being decreased, a total overlapped region between the first group of the passages 233 and the memory module 90 may be smaller than a total overlapped region between the second group of the passages 235 and the memory module 90. Thus, numbers of the second group of the passages 235 may be greater than numbers of the first group of the passages 233.

When the cooling fluid introduced into the liquid cooling structure 200 through the channel inlet 231 may pass through the first group of the passages 233, i.e., the first passage 233A and the second passage 233B, the cooling fluid may have different temperatures. That is, the temperature of the cooling fluid passing through the first passage 233A may be different from the temperature of the cooling fluid passing through the second passage 233B due to a heating value difference of the object by positions. The connection passage 234 may function as to mix the cooling fluids having the different temperatures, which may pass through the first group of the passages 233, with each other to average the temperatures of the cooling fluids. Therefore, the cooling fluids having the uniform temperature may be supplied to the second group of the passages 235 branched from the connection passage 234 to improve the cooling efficiency.

Viewed from the flowing direction of the cooling fluid, the first group of the passages 233 may be positioned at an upstream region of the liquid cooling structure 200. Thus, the first group of the passages 233, i.e., the first passage 233A and the second passage 233B may be branched from the region adjacent to the channel inlet 231. The branched first and second passages 233A and 233B may be joined at the connection passage 234. The branched position of the first and second passages 233A and 233B in the first direction D1 may be one end of the memory module 90. The first group of the passages 233 may have a "□" planar shape.

The first passage 233A and the second passage 233B may function as to cool the upper portion and the lower portion of the memory module 90 in the second direction D2, respectively. The first passage 233A and the second passage 233B may be a linear shape, which may have at least one inflection point, connected between the channel inlet 231 and the connection passage 234. The inflection point of the first passage 233A and the second passage 233B may have a rounded shape for smooth flowing of the cooling fluid. The first passage 233A and the second passage 233B may have a square shape, a rectangular shape, a polygonal shape, an elliptical shape having both flat sides in a short axial direction, etc. The second passage 233B may have a height H substantially the same as a height of the first passage 233A. The second passage 233B may have a cross aspect ratio substantially the same as or different from a cross aspect ratio of the first passage 233A. In other words, the cross-sectional shape of the second passage 233B may be substantially the same as or different from the cross-sectional shape of the first passage 233A. Thus, when the cross aspect ratio of the second passage 233B is substantially the same as the cross aspect ratio of the first passage 233A, the second passage 233B may have a width W2 substantially the same as a width W1 of the first passage 233A. In contrast, when the cross aspect ratio of the second passage 233B is different from the cross aspect ratio of the first passage 233A, the width W2 of the second passage 233B may be different from the width W1 of the first passage 233A.

The lower portion of the memory module 90 may have a heating value greater than that of the upper portion of the memory module 90 in the second direction. Thus, an overlapped area between the first passage 233A and the memory module 90 may be smaller than an overlapped region between the second passage 233B and the memory module 90. Because the height H of the first passage 233A may be substantially the same as the height H of the second passage 233B, the width W2 of the second passage 233B may be wider than the width W1 of the first passage 233A. Fluxes and speeds of the cooling fluids in the first and second passages 233A and 233B may be controlled by the width W1 of the first passage 233A and the width W2 of the second passage 233B.

Viewed from the flowing direction of the cooling fluid, the second group of the passages 235 may be positioned at a downstream region of the liquid cooling structure 200. Thus, the second group of the passages 235, i.e., the third to fifth passages 235A, 235B and 235C may be branched from the connection passage 234. The branched third to fifth passages 235A, 235B and 235C may be joined at the region adjacent to the channel outlet 232. In an embodiment, a channel inlet may be branched into passages, these branched passages may then be joined at a region adjacent to a connection passage, these joined passages at the connection passage may then be re-branched from the connection passage to form re-branched passages, and then these re-branched passages may be re-joined at a region adjacent to the channel outlet. For example, the channel 230 may be branched into passages (i.e., first and second passages 233A and 233B) at a region adjacent to the channel inlet 231 as shown in FIG. 5 and then joined at the connection passage 234. The joined passages may then be re-branched from the connection passage 234 to form re-branched passages (i.e., the third to fifth passages 235A, 235B and 235C), and then these re-branched passages (i.e., third to fifth passages 235A, 235B and 235C) may be re-joined at the region adjacent to the channel outlet 232 as shown in FIG. 5. The joined position of the third to fifth passages 235A, 235B and 235C in the first direction D1 may be the other end of the memory module 90. The second group of the passages 235 may have a "日" planar shape.

In order to prevent the cooling efficiency of the downstream region from being decreased compared to the cooling efficiency of the upstream region because the second group of the passages 235 may be positioned at the downstream region of the liquid cooling structure 200, a total overlapped region between the second group of the passages 235 and the memory module 90 may be larger than a total overlapped region between the first group of the passages 233 and the memory module 90. Thus, numbers of the second group of the passages 235 may be greater than numbers of the first group of the passages 233. The temperature of the cooling fluid at the connection passage 234 may be higher than the temperature of the cooling fluid at the channel inlet 231. Further, the downstream region of the memory module 90 may be cooled using the cooling fluid passing through the upstream region to have an increased temperature.

Each of the third passage 235A, the fourth passage 235B and the fifth passage 235C may be connected between the connection passage 234 and the channel outlet 232 to cool the upper portion, the middle portion and the lower portion of the memory module 90, respectively, in the second direction D2. The third passage 235A, the fourth passage 235B and the fifth passage 235C may be a linear shape, which may have at least one inflection point, connected between the connection passage 234 and the channel outlet 232. The inflection point of the third to fifth passages 235A, 235B and 235C may have a rounded shape for the smooth flowing of the cooling fluid. The third to fifth passages 235A, 235B and 235C may have a square shape, a rectangular shape, a polygonal shape, an elliptical shape having both flat sides in a short axial direction, etc. The third to fifth passages 235A, 235B and 235C may have substantially the same height H. The third to fifth passage 235A, 235B and 235C may have substantially the same cross aspect ratio or different cross aspect ratios.

The lower portion of the memory module 90 in the second direction D2 may have the highest heating value. In contrast, the middle portion of the memory module 90 in the second direction D2 may have the lowest heating value. Thus, an overlapped area between the fifth passage 235C and the memory module 90 may be relatively large and an overlapped area between the fourth passage 235B and the memory module 90 may be relatively small. Particularly, because the third to fifth passages 235A, 235B and 235C may have substantially the same height H, a width W5 of the fifth passage 235C may be substantially the same as a width W3 of the third passage 235A and a width W4 of the fourth passage 235B may be narrower than the width W5 of the fifth passage 235C and the width W3 of the third passage 235A. That is, fluxes and speeds of the cooling fluids in the third passage 235A, the fourth passage 235B and the fifth passage 235C may be controlled by the width W3 of the third passage 235A, the width W4 of the fourth passage 235B and the width W5 of the fifth passage 235C.

As mentioned above, the cross aspect ratios and the planar shapes of the first group of the passages 233 and the second group of the passages 235 may be changed in accordance with kinds of the memory module 90, i.e., arrangements and kinds of the semiconductor devices 96 on the PCB 92. In other words, the cross aspect ratios and the planar shapes of the first group of the passages 233 and the second group of the passages 235 may be changed in accordance with heating values of the memory module 90 by positions.

Meanwhile, in the second example embodiments, a case in which the shape of the channel 230 is defined by molding the upper structure 220 is exemplified, but is not limited thereto. As another example embodiment, the shape of the channel 230 may be defined by a porous member or a pin structure fixedly installed on the lower structure 210 or the upper structure 220. Here, the pin structure may include a plurality of pins spaced apart from each other, and each of the plurality of pins may have a column shape. In addition, the planar shape of each of the plurality of pins may be a triangular or more polygonal, circular, or elliptical shape.

Further, in the second example embodiments, a case in which each of the plurality of passages constituting the channel 230 is separated from each other by molding the upper structure 220 is illustrated, but is not limited thereto. As another example embodiment, each of the plurality of passages may be separated from each other by a porous member or a pin structure formed in the channel 230.

In the second example embodiments, the second group of the passages 235 may be physically separated from each other, not restricted within the above structure. As shown in FIG. 6C, in a liquid cooling structure 200' of another example embodiment, the third passage 235A and the fourth passage 235B may be connected with each other through a first sub-passage 236. Further, the fourth passage 235B and the fifth passage 235C may be connected with each other through a second sub-passage 237. The first and second sub-passages 236 and 237 may function as to increase a supplying amount of the cooling fluid and the overlapped area between the cooling fluid and the memory module 90. Further, in order to suppress a pressure drop generated by the first and second sub-passages 236 and 237 between the second group of the passages 235, the first and second sub-passages 236 and 237 may have a height H' lower than the height H of the second group of the passages 235.

In FIG. 6C, a case in which the first sub-passage 236 and the second sub-passage 237 are formed by molding the upper structure 220 is illustrated, but is not limited thereto. As another example embodiment, although not shown in the drawings, the first sub-passage 236 and the second sub-passage 237 may be formed by a porous member or a pin structure fixedly installed on the upper structure 220. The porous member and the pin structure may be fixed to the lower structure 210. It may serve to provide the first sub-passage 236 and the second sub-passage 237 having a height H' lower than the height H of each of the second group of the passages 235.

According to the second example embodiments, the liquid cooling structure 200 may include the lower structure 210 configured to cover the one surface of the object and the upper structure 220 combined with the lower structure 210 to provide the channel 230 through which the cooling fluid may flow. The channel 230 may include the passages branched from the region adjacent to the channel inlet 231 and joined at the region adjacent to the channel outlet 232 to improve the cooling efficiency of the object.

Further, the overlapped area and the overlapped region between the object and the channel 230 may be readily controlled by the passages of the channel 230 to more improve the cooling efficiency of the object.

Furthermore, the channel 230 may additionally include the connection passage 234 for controlling the temperature of the cooling fluid to more improve the cooling efficiency of the object.

Moreover, the overlapped area between the second group of the passages 235 and the memory module 90 may be larger than the overlapped area between the first group of the passages 233 and the memory module 90 to more improve the cooling efficiency of the object.

Figure 9A:
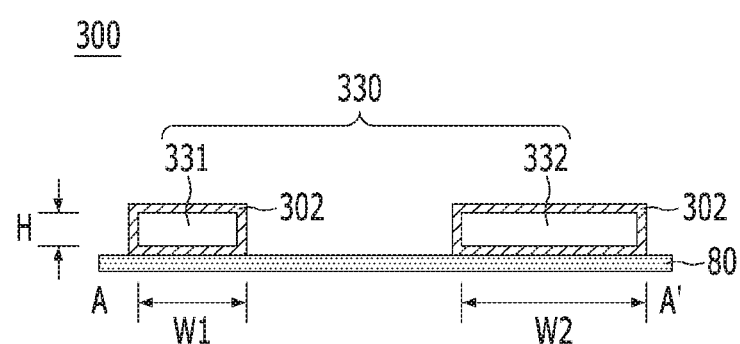
FIG. 9A is a cross-sectional view taken along a line A-A' in FIG. 8 in accordance with the third example embodiments.
Figure 9B:
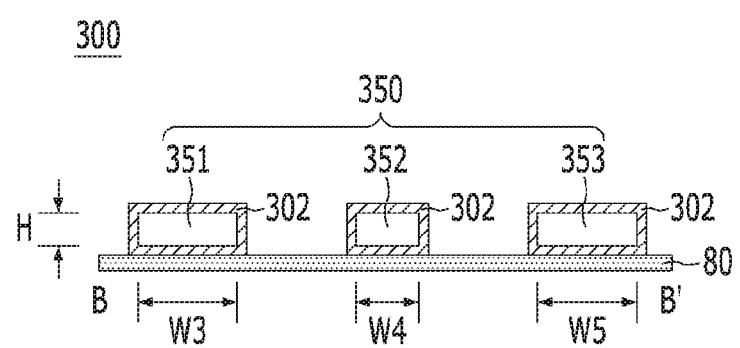
FIG. 9B is a cross-sectional view taken along a line B-B' in FIG. 8 in accordance with the third example embodiments.

FIG. 7 is a perspective view illustrating a liquid cooling structure in accordance with third example embodiments, FIG. 8 is a plan view illustrating a liquid cooling structure in accordance with the third example embodiments, FIG. 9A is a cross-sectional view taken along a line A-A' in FIG. 8 in accordance with the third example embodiments, and FIG. 9B is a cross-sectional view taken along a line B-B' in FIG. 8 in accordance with the third example embodiments.

For conveniences of explanations, the same reference numerals in the first and second examples of embodiments may refer to the same element of the third example embodiments and any further illustrations with respect to the same element may be omitted herein for brevity.

Referring to FIGS. 7, 8, 9A and 9B, a liquid cooling structure 300 of the third example embodiments may include a heat dissipation pad 80 and a heat dissipation pipe 302. In an embodiment, the heat dissipation pipe 302 may be a quadrangular heat dissipation pipe including a channel having at least one passage that has a cross-sectional shape that is substantially quadrangular. The heat dissipation pad 80 may be configured to cover one surface of a memory module 90 as the object. The heat dissipation pipe 302 may be configured to make contact with the heat dissipation pad 80. The heat dissipation pipe 302 may be overlapped with the memory module 90. The heat dissipation pipe 302 may include a channel 360 through which the cooling fluid may flow. The channel 360 may have a structure substantially similar to that of the channel 230 of the second example embodiments. That is, the channel 360 may include a channel inlet 310, a channel outlet 320 and a connection passage 340. The cooling fluid may enter into the liquid cooling structure 300 through the channel inlet 310. The cooling fluid may exit from the liquid cooling structure 300 through the channel outlet 320. The connection passage 340 may be positioned between the channel inlet 310 and the channel outlet 320. The channel 360 may further include a first group of quadrangular passages 330 connected between the channel inlet 310 and the connection passage 340, and a second group of quadrangular passages 350 connected between the connection passage 340 and the channel outlet 320. An arrow in drawings may be the flowing direction of the cooling fluid. The cooling fluid may include, for example but not limited to, water.

The heat dissipation pad 80 may function as to a buffer member between the memory module 90 and the heat dissipation pipe 302. Further, the heat dissipation pad 80 may function as to supplement a dead zone of the heat dissipation of the heat dissipation pipe 302. Thus, the heat dissipation pad 80 may include an elastic material having a high thermal conductivity, for example, a thermal interface material (TIM). The heat dissipation pad 80 may be configured to fully cover the semiconductor devices 96 on the memory module 90. Thus, the heat dissipation pad 80 may have a flat plate shape configured to fully cover the semiconductor devices 96 on one surface of the memory module 90.

The heat dissipation pipe 302 having the channel 360 through which the cooling fluid may flow may include a readily processes material having a high thermal conductivity, for example, a metal. The heat dissipation pipe 302 may be formed by a press process, for example, a bulging process.

The channel 360 may have a structure substantially the same as the channel 230 of the second example embodiments. Particularly, the channel 360 may include the first group of the quadrangular passages 330 connected between the channel inlet 310 and the connection passage 340, and the second group of the quadrangular passages 350 connected between the connection passage 340 and the channel outlet 320. The first group of the passages 330 may include a first passage 331 and a second passage 332. The second group of the passages 350 may include a third passage 351, a fourth passage 352 and a fifth passage 353.

The first group of the passages 330 including the first passage 331 and the second passage 332 in accordance with the first example embodiments may have a structure substantially the same as that of the first group of the passages 233 including the first passage 233A and the second passage 233B in accordance with the second example embodiments. The connection passage 340 of the third example embodiments may have a structure substantially the same as that of the connection passage 234 of the second example embodiments. The second group of the passages 350 including the third passage 351, the fourth passage 352 and the fifth passage 353 in accordance with the third example embodiments may have a structure substantially the same as those of the second group of the passages 235 including the third passage 235A, the fourth passage 235B and the fifth passage 235C in accordance with the second example embodiments. Thus, any further illustrations with respect to the channel 360 of the third example embodiments may be omitted herein for brevity.

Meanwhile, although not shown in the drawings, the second group of the passages 350 may further include sub-passages connecting between the third passage 351 and the fourth passage 352, and between the fourth passage 352 and the fifth passage 353. The sub-passages may have a height lower than that of the second group of the passages 350.

In addition, in the third example embodiments, a case in which each of the plurality of passages constituting the channel 360 is separated from each other by molding the heat dissipation pipe 302 is illustrated, but is not limited thereto. As another example embodiment, each of the plurality of passages may be separated from each other by a porous member or a pin structure formed in the channel 360.

According to the third example embodiments, the liquid cooling structure 300 may include the heat dissipation pipe 302 and the heat dissipation pad inserted between the heat dissipation pipe 302 and the object. Thus, the liquid cooling structure 300 may be readily attached to and detached from the object. Further, the liquid cooling structure 300 may be easily maintained and repaired.

Further, the heat dissipation pipe 302 may include the channel 360 including the passages branched from the region adjacent to the channel inlet 310 and joined at the region adjacent to the channel outlet 320 to improve the cooling efficiency of the object.

Further, the overlapped area and the overlapped region between the object and the channel 360 may be readily controlled by the passages of the channel 360 to more improve the cooling efficiency of the object.

Furthermore, the channel 360 may additionally include the connection passage 340 for controlling the temperature of the cooling fluid to more improve the cooling efficiency of the object.

Moreover, the overlapped area between the second group of the passages 350 and the memory module 90 may be larger than the overlapped area between the first group of the passages 330 and the memory module 90 to more improve the cooling efficiency of the object.

Figure 11:
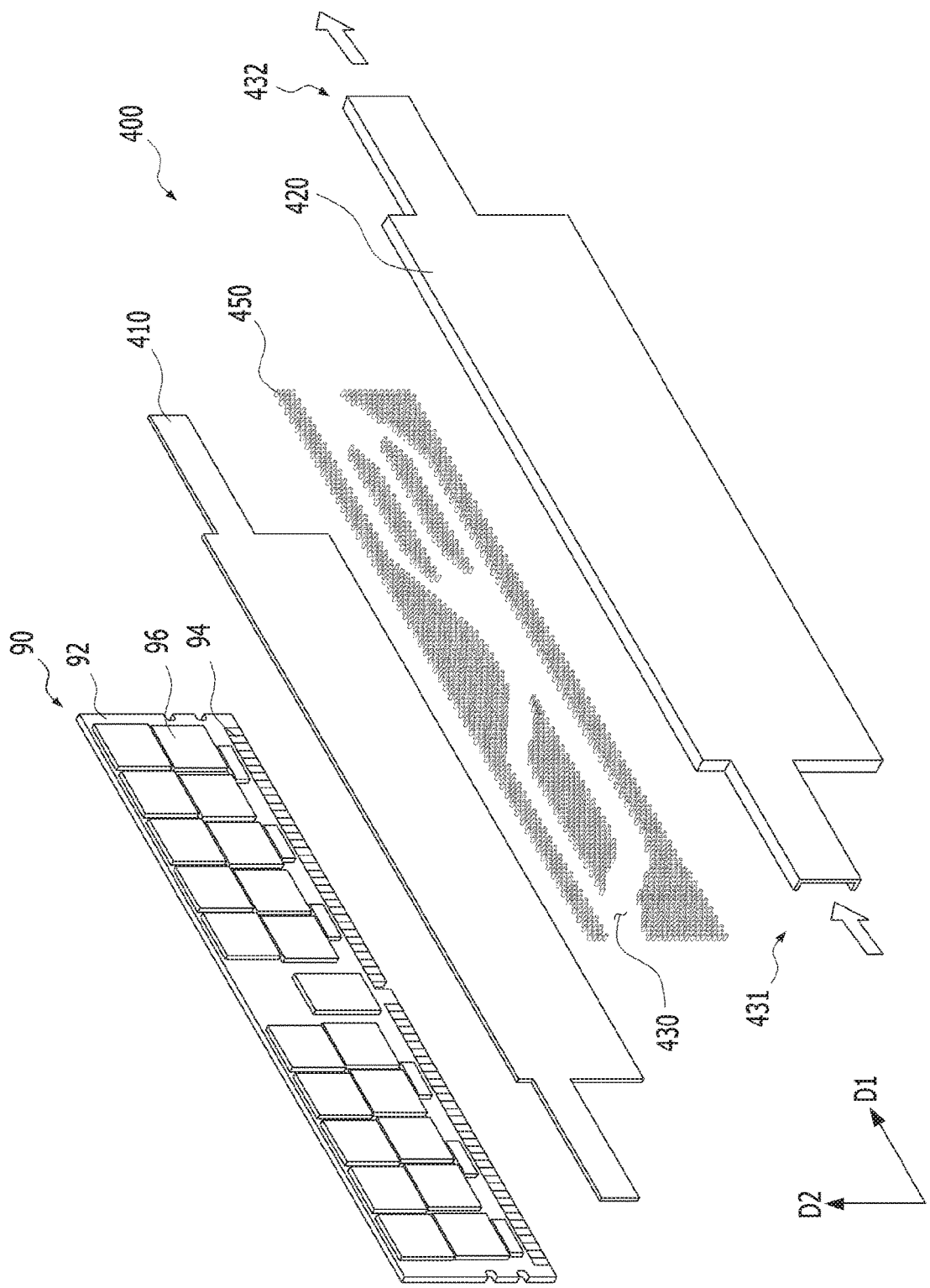
Figure 12:
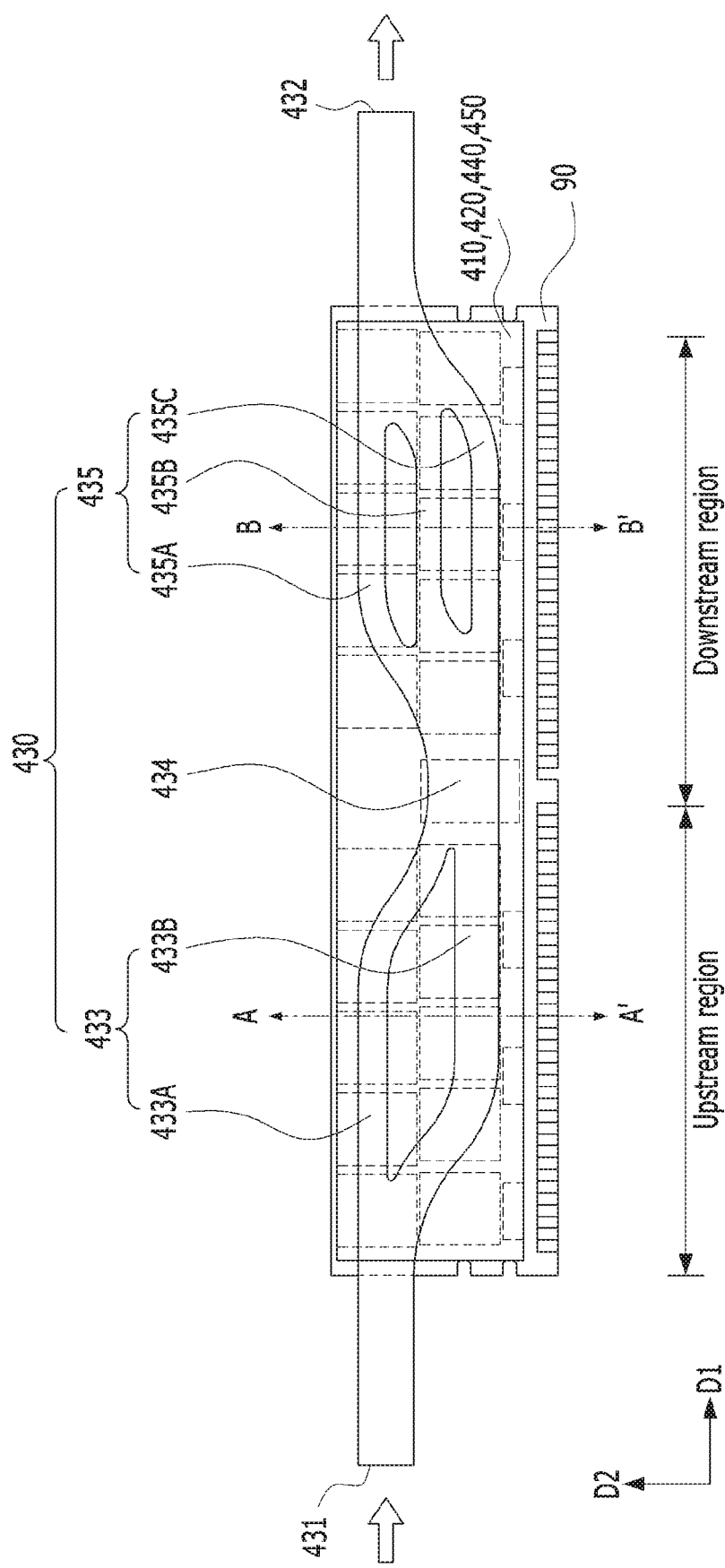
FIG. 12 is a plan view illustrating a liquid cooling structure in accordance with the fourth example embodiments.
Figure 13A:
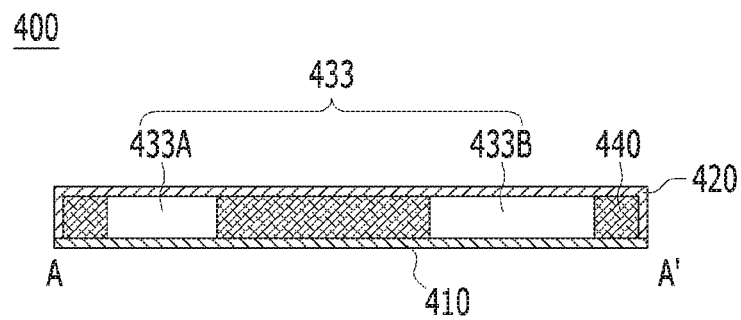
FIG. 13A is a cross-sectional view taken along a line A-A' in FIG. 12 in accordance with the fourth example embodiments.
Figure 13B:
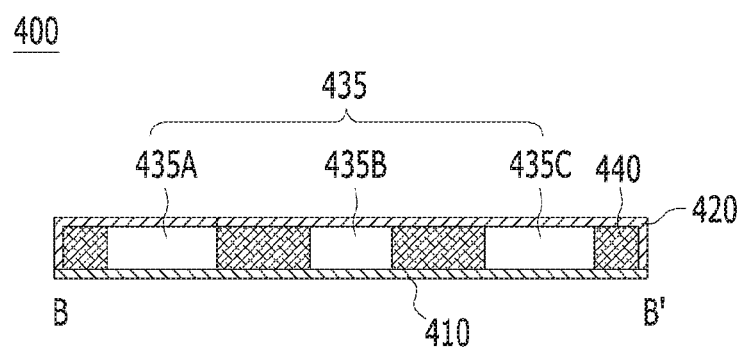
FIG. 13B is a cross-sectional view taken along a line B-B' in FIG. 12 in accordance with the fourth example embodiments.
Figure 13C:
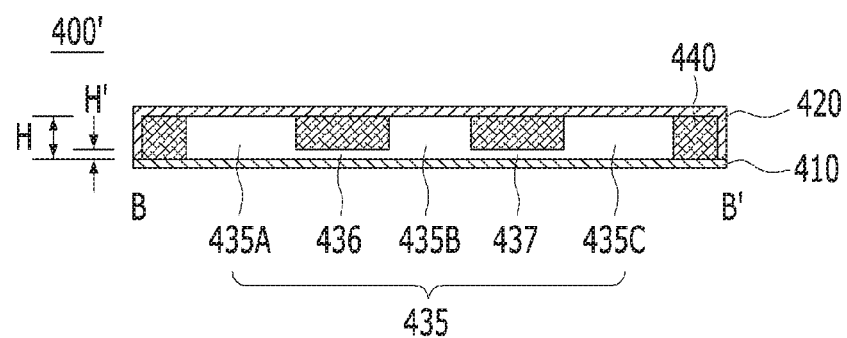
FIG. 13C is a cross-sectional view taken along a line B-B' in FIG. 12 in accordance with another example embodiment.

FIG. 10 and FIG. 11 are perspective view illustrating a liquid cooling structure in accordance with fourth example embodiments, FIG. 12 is a plan view illustrating a liquid cooling structure in accordance with the fourth example embodiments, FIG. 13A is a cross-sectional view taken along a line A-A' in FIG. 12 in accordance with the fourth example embodiments, FIG. 13B is a cross-sectional view taken along a line B-B' in FIG. 12 in accordance with the fourth example embodiments, and FIG. 13C is a cross-sectional view taken along a line B-B' in FIG. 12 in accordance with another example embodiment.

For conveniences of explanations, the same reference numerals in the first to third example embodiments may refer to the same element of the fourth example embodiments and any further illustrations with respect to the same element may be omitted herein for brevity.

Referring to FIGS. 10, 12, 13A and 13B, a liquid cooling structure 400 of the fourth example embodiments may include a lower structure 410, a porous member 440 and an upper structure 420. The lower structure 410 may be configured to cover one surface of a memory module 90 as the object. The porous member 440 may be overlapped with the memory module 90. The porous member 440 provides a channel 430 through which the cooling fluid may flow. The upper structure 420 may be combined with the lower structure 410 to seal the porous member 440.

On the other hand, as shown in FIG. 11, the liquid cooling structure 400 according to the fourth example embodiments may include a pin structure 450 instead of the porous member 440. Like the porous member 440, the pin structure 450 provides the channel 430 through which the cooling fluid may flow. Here, the pin structure 450 may include a plurality of pins spaced apart from each other, and each of the plurality of pins may have a column shape. In addition, the planar shape of each of the plurality of pins may be a triangular or more polygonal, circular, or elliptical shape.

The channel 430 may include a channel inlet 431, a channel outlet 432 and a connection passage 434. The cooling fluid may enter into the liquid cooling structure 400 through the channel inlet 431. The cooling fluid may exit from the liquid cooling structure 400 through the channel outlet 432. The connection passage 434 may be positioned between the channel inlet 431 and the channel outlet 434. The connection passage 434 may function as to physically control a temperature of the cooling fluid. The channel 430 may further include a first group of quadrangular passages 433 connected between the channel inlet 431 and the connection passage 434, and a second group of quadrangular passages 435 connected between the connection passage 434 and the channel outlet 432. An arrow in drawings may be the flowing direction of the cooling fluid. The cooling fluid may include, for example but not limited to, water. The channel 430 according to the fourth example embodiments is substantially the same as the channel 230 according to the second example embodiments. Therefore, an additional description of the channel 430 will be omitted here for brevity.

In the fourth example embodiments, the second group of the passages 435 may be physically separated from each other, not restricted within the above structure. As shown in FIG. 13C, in a liquid cooling structure 400' of another example embodiment, the third passage 435A and the fourth passage 435B may be connected with each other through a first sub-passage 436. Further, the fourth passage 435B and the fifth passage 435C may be connected with each other through a second sub-passage 437. The first and second sub-passages 436 and 437 may function as to increase a supplying amount of the cooling fluid and the overlapped area between the cooling fluid and the memory module 90. Further, in order to suppress a pressure drop generated by the first and second sub-passages 436 and 437 between the second group of the passages 235, the first and second sub-passages 436 and 437 may have a height H' lower than the height H of the second group of the passages 235.

According to the fourth example embodiments, the liquid cooling structure 400 has the channel 430 including the passages branched from the region adjacent to the channel inlet 431 and joined at the region adjacent to the channel outlet 432 to improve the cooling efficiency of the object.

In addition, by providing the porous member 440 or the pin structure 450 providing the channel 430, it is possible to further improve the cooling efficiency of the object to be cooled.

Figure 14:
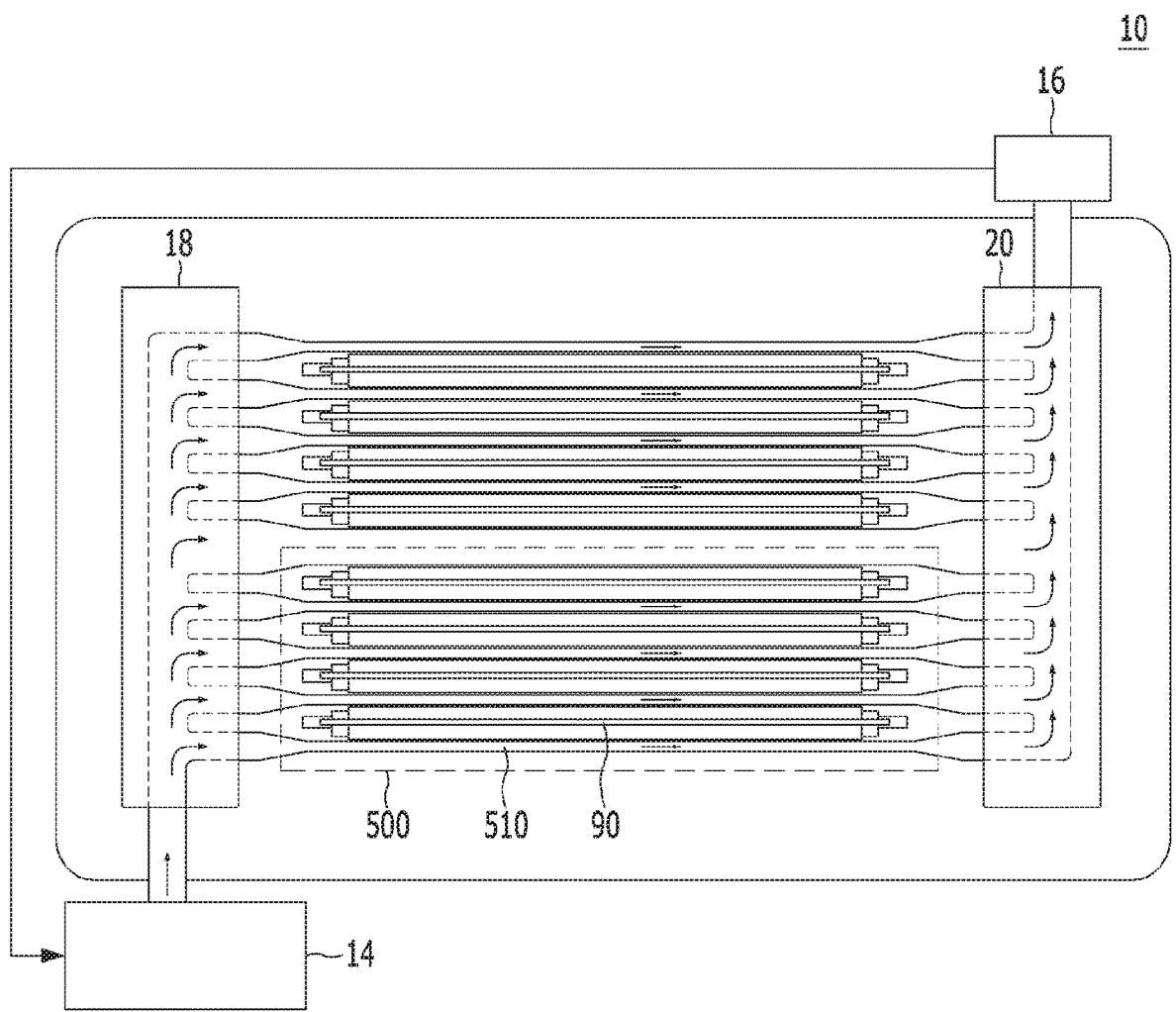
FIG. 14 is a plan view illustrating a liquid cooling system in accordance with examples of embodiments.

FIG. 14 is a plan view illustrating a liquid cooling system in accordance with examples of embodiments.

Referring to FIG. 14, a liquid cooling system 10 may include at least one liquid cooling structure 510 and a memory system 500, a cooling fluid supply system 14 and a recirculation system 16. The memory system 500 may include at least one memory module 90. The cooling fluid supply system 14 may be configured to supply the cooling fluid to the memory system 500. The recirculation system 16 may be configured to collect the cooling fluid circulated through the memory system 500 to have an increased temperature and to transfer the cooling fluid to the cooling fluid supply system 14.

The liquid cooling structure 510 may include any one of the liquid cooling structures 100, 100', 200, 200', 300, 400 and 400' of the first to fourth examples of embodiments. The memory module 90 as the object may include a PCB and a plurality of semiconductor devices. The PCB may include a connection terminal installed at the lower portion of the memory module 90 and electrically connected to a module socket. The semiconductor devices may be mounted on the PCB. The cooling fluid supply system 14 may include a pump and a cooler. The pump may be configured to move the cooling fluid. The cooler may be configured to re-cool the cooling fluid having the increased temperature received from the recirculation system 16. The cooling fluid supply system 14 may continuously or discontinuously supply the cooling fluid to control a temperature of the memory system 500. The recirculation system 16 may include a pump and a filter. The pump may be configured to collect the cooling fluid having the increased temperature by circulating the memory system 500 and to supply the cooling fluid to the cooling fluid supply system 14. The filter may be configured to remove impurities from the cooling fluid having the increased temperature.

The liquid cooling system 10 may further include a system board 12, a first manifold 18 and a second manifold 20. The system board 12 may include a module socket configured to receive the memory system 500. The first manifold 18 may be arranged at one side of the system board 12. The first manifold 18 may be configured to receive the cooling fluid from the cooling fluid supply system 14 and to supply the cooling fluid to the liquid cooling structures 510 in the memory system 500. The second manifold 20 may be arranged at the other side of the system board 12. The second manifold 20 may be configured to supply the cooling fluid discharged from the liquid cooling structures 510 in the memory system 500 to the recirculation system 16. Although not depicted in drawings, the first manifold 18 may include a plurality of valves configured to control fluxes and speeds of the cooling fluids supplied to the liquid cooling structures 510 in the memory system 500.

Figure 15:
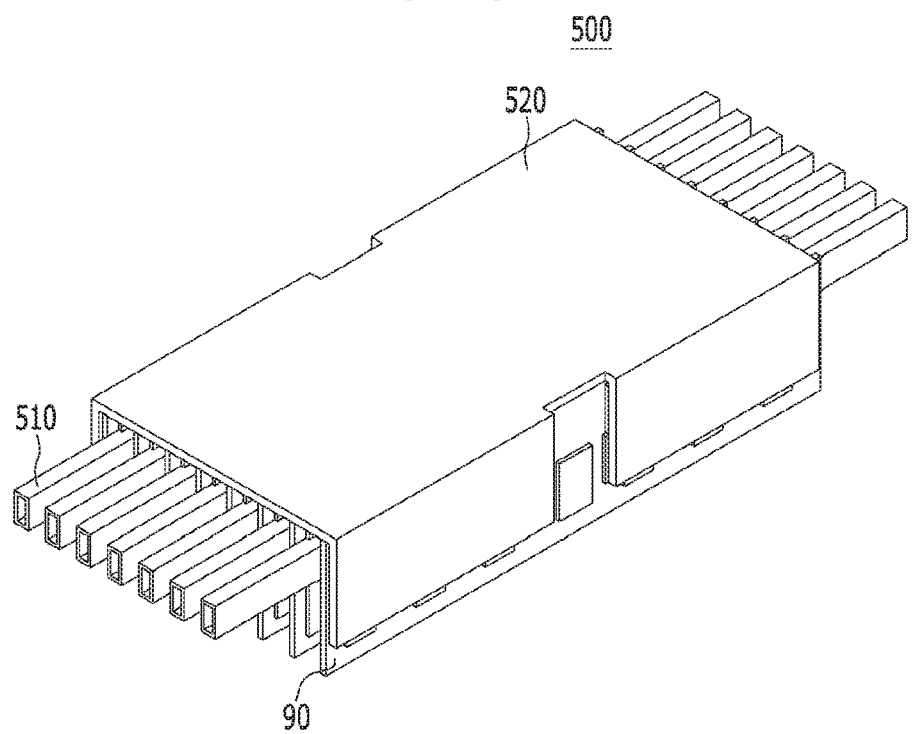
FIG. 15 is a perspective view illustrating a memory system of a liquid cooling system in accordance with examples of embodiments.

FIG. 15 is a perspective view illustrating a memory system of a liquid cooling system in accordance with examples of embodiments.

Referring to FIG. 15, a memory system 400 of this example embodiment may include a plurality of memory modules 90 and a plurality of liquid cooling structures 510 and a memory cover 520. The liquid cooling structures 510 may be inserted into the memory modules 90. An outermost memory module 90 in the memory system 500 may have one surface configured to make contact with the liquid cooling structure 510 and the other surface configured to make contact with the memory cover 520.

The memory cover 520 may function as to a heat dissipation member. Further, the memory cover 520 may function as to closely contact the memory modules 90 with the liquid cooling structures 510 to improve heat exchange efficiency between the memory modules 90 and the liquid cooling structures 510. Thus, the memory cover 520 may be combined with the memory system 500 in a tight fit. Further, the memory cover 520 may include a metal having a high thermal conductivity.

In examples of embodiments, the outermost memory module 90 in the memory system 500 may have one surface configured to make contact with the liquid cooling structure 510 and the other surface configured to make contact with the memory cover 520, not restricted within the above structure. Alternatively, one surface and the other surface of the outermost memory module 90 in the memory system 500 may make contact with the different liquid cooling structures 510. In this case, the outermost memory module 90 in the memory system 400 may have one surface configured to make contact with the memory module 90 and the other surface configured to make contact with the memory cover 420.

Figure 16:
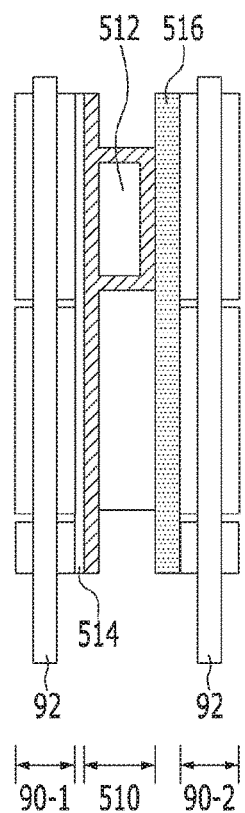
FIGS. 16 and 17 are cross-sectional views illustrating a memory system of a liquid cooling system in accordance with examples of embodiments.
Figure 17:
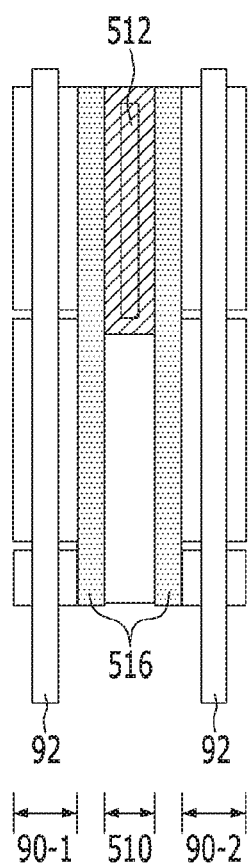

FIGS. 16 and 17 are cross-sectional views illustrating a memory system of a liquid cooling system in accordance with examples of embodiments.

Referring to FIG. 16, a memory system 500 may include a first memory module 90-1 and a second memory module 90-2. The liquid cooling structure 510 may be inserted into a space between the first memory module 90-1 and the second memory module 90-2. The liquid cooling structure 510 may be any one of the liquid cooling structures 100, 100', 200, 200', 400 and 400' of the first, second and fourth examples of embodiments. A reference numeral 512 may be a channel of the liquid cooling structure 510 and a reference numeral 90 may be a PCB of the memory modules 90-1 and 90-2.

A surface of the first memory module 90-1 may be adjacent to the lower structure of the liquid cooling structure 510. The surface of the first memory module 90-1 may be attached to the lower structure of the liquid cooling structure 510 using a thermal tape 514. A surface of the second memory module 90-2 may be adjacent to the upper structure of the liquid cooling structure 510. A heat dissipation pad 516 may be inserted into a space between the surface of the second memory module 90-2 and the upper structure of the liquid cooling structure 510. That is, the surface of the second memory module 90-2 may make contact with the upper structure of the liquid cooling structure 510 via the heat dissipation pad 516.

Referring to FIG. 17, a memory system 500 may include a first memory module 90-1 and a second memory module 90-2. The liquid cooling structure 510 may be inserted into a space between the first memory module 90-1 and the second memory module 90-2. The liquid cooling structure 510 may be the liquid cooling structures 300, 400 and 400' of the third and fourth example of embodiments. A reference numeral 512 may be a channel of the liquid cooling structure 510 and a reference numeral 90 may be a PCB of the memory modules 90-1 and 90-2.

The first and second memory modules 90-1 and 90-2 may be positioned at both sides of the liquid cooling structure 510. The heat dissipation pad 516 may be inserted into a space between the liquid cooling structure 510 and the first and second memory modules 90-1 and 90-2.

The above described embodiments of the present disclosure are intended to illustrate and not to limit the present disclosure. Various alternatives and equivalents are possible. The embodiments are not limited by the embodiments described herein. Nor are the embodiments limited to any specific type of semiconductor device.

What is claimed is:

1. A liquid cooling structure for cooling a memory module, the liquid cooling structure comprising:
   a lower structure configured to cover one surface of the memory module; and
   an upper structure combined with the lower structure to form a channel through which a cooling fluid flows,
   wherein the channel comprises an inlet of the channel where the cooling fluid enters, n passages branched at a region adjacent to the inlet of the channel, a connection passage where the n passages join, m passages re-branched at the connection passage and an outlet of the channel where the cooling fluid exits,
   wherein the channel is divided into an upstream region where the n passages are arranged, and a downstream region where the m passages are arranged based on the connection passage, and
   wherein "n" is a natural number greater than or equal to 1 and "m" is a natural number greater than the "n".

2. The liquid cooling structure of claim 1,
   wherein the channel further comprises a sub-passage positioned between adjacent passages among the plurality of passages to connect the adjacent passages with each other, the sub-passage has a height lower than a height of the adjacent passages, and a cross-sectional shape of the sub-passage is substantially quadrangular.

3. The liquid cooling structure of claim 2,
   wherein the sub-passage comprises a porous member or a pin structure formed in the sub-passage to have a height lower than that of adjacent passages.

4. The liquid cooling structure of claim 1,
   wherein the m passages are re-joined at a region adjacent to the outlet of the channel.

5. The liquid cooling structure of claim 4,
   wherein each of the connection passage and the plurality of passages are separated from each other by molding the upper structure, or by a porous member or a pin structure formed in the channel.

6. The liquid cooling structure of claim 1,
   wherein each of the passages have a cross-sectional shape that is substantially quadrangular.

7. The liquid cooling structure of claim 1,
   wherein each of the passages has one or more of a square shape, a rectangular shape, a polygonal shape and an elliptical shape having both flat surfaces in a short axial direction, and the passages have substantially the same height.

8. The liquid cooling structure of claim 1,
   wherein the lower structure comprises a metal plate having a flat surface or a metal plate having a topology corresponding to a step on one surface of the memory module.

9. The liquid cooling structure of claim 1,
   wherein the upper structure comprises a metal plate having an engraved structure to form the channel, or a frame-shaped metal plate having one opened portion corresponding to a shape of the channel, wherein the one opened portion is downwardly oriented to combine the upper structure with the lower structure, thereby forming the channel.

10. The liquid cooling structure of claim 1,
    wherein the channel is defined by a porous member or a pin structure fixedly installed on the lower structure or the upper structure.

11. The liquid cooling structure of claim 1,
    wherein the memory module comprises a printed circuit board (PCB) including a first surface and a second surface, and a plurality of semiconductor devices mounted on at least one of the first and second surfaces of the PCB, and the PCB comprises a connection terminal connected to a module socket at a lower portion of the PCB.

12. The liquid cooling structure of claim 1,
    wherein the connection passage is positioned at a middle portion of the memory module.

13. The liquid cooling structure of claim 1,
    wherein an overlapped area between the m passages of the downstream region and the memory module is larger than an overlapped area between the n passage of the upstream region and the memory module.

14. The liquid cooling structure of claim 1,
    wherein an overlapped area between the lower structure and the memory module is larger than an overlapped area between the upper structure and the memory module.

15. The liquid cooling structure of claim 1,
    wherein a thermal conductivity of the upper structure is different from a thermal conductivity of the lower structure.

16. The liquid cooling structure of claim 1,
    wherein the inlet of the channel and the outlet of the channel are spaced apart from each other by a distance greater than a length of the memory module.

17. The liquid cooling structure of claim 16,
    wherein the connection passage is positioned at a middle portion between the inlet of the channel and the outlet of the channel.

* * * * *